(12) United States Patent
Hoka et al.

(10) Patent No.: US 8,772,781 B2
(45) Date of Patent: Jul. 8, 2014

(54) WIRING STRUCTURE, THIN FILM TRANSISTOR ARRAY SUBSTRATE INCLUDING THE SAME, AND DISPLAY DEVICE

(71) Applicants: Naruhito Hoka, Tokyo (JP); Shingo Nagano, Tokyo (JP); Takeshi Shimamura, Tokyo (JP); Osamu Miyakawa, Koshi (JP)

(72) Inventors: Naruhito Hoka, Tokyo (JP); Shingo Nagano, Tokyo (JP); Takeshi Shimamura, Tokyo (JP); Osamu Miyakawa, Koshi (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/665,412

(22) Filed: Oct. 31, 2012

(65) Prior Publication Data
US 2013/0112978 A1    May 9, 2013

(30) Foreign Application Priority Data
Nov. 7, 2011    (JP) .................................. 2011-243076

(51) Int. Cl.
| | | |
|---|---|---|
| *H01L 29/04* | (2006.01) | |
| *H01L 31/20* | (2006.01) | |
| *H01L 31/036* | (2006.01) | |
| *H01L 31/0376* | (2006.01) | |

(52) U.S. Cl.
USPC ................................ 257/59; 257/57; 438/158

(58) Field of Classification Search
USPC ........... 257/57, 59, 66, 72, E29.285; 438/158
See application file for complete search history.

(56) References Cited

U.S. PATENT DOCUMENTS

| 6,646,707 B2 | 11/2003 | Noh et al. | |
|---|---|---|---|
| 2009/0200557 A1* | 8/2009 | Kamata | ........................... 257/66 |
| 2012/0037906 A1* | 2/2012 | Ryu et al. | ......................... 257/57 |
| 2012/0113376 A1* | 5/2012 | Hayashi et al. | ................ 349/141 |

FOREIGN PATENT DOCUMENTS

| JP | 3826217 B2 | 7/2006 |
|---|---|---|
| JP | 2010-191410 A | 9/2010 |

* cited by examiner

*Primary Examiner* — Phuc Dang
(74) *Attorney, Agent, or Firm* — Studebaker & Brackett PC

(57) ABSTRACT

On each of wiring conversion parts connected to a first conductive film and a second conductive film each functioning as a wiring, a first transparent conductive film does not cover an end surface of the second conductive film in proximity to a corner of the first transparent conductive film, and has a portion covering the end surface of the second conductive film on a portion other than the proximity of the corners. A second transparent conductive film as an upper layer of the first transparent conductive film is connected to the first conductive film and the second conductive film, so that the first conductive film and the second conductive film are electrically connected.

7 Claims, 23 Drawing Sheets

F I G . 2
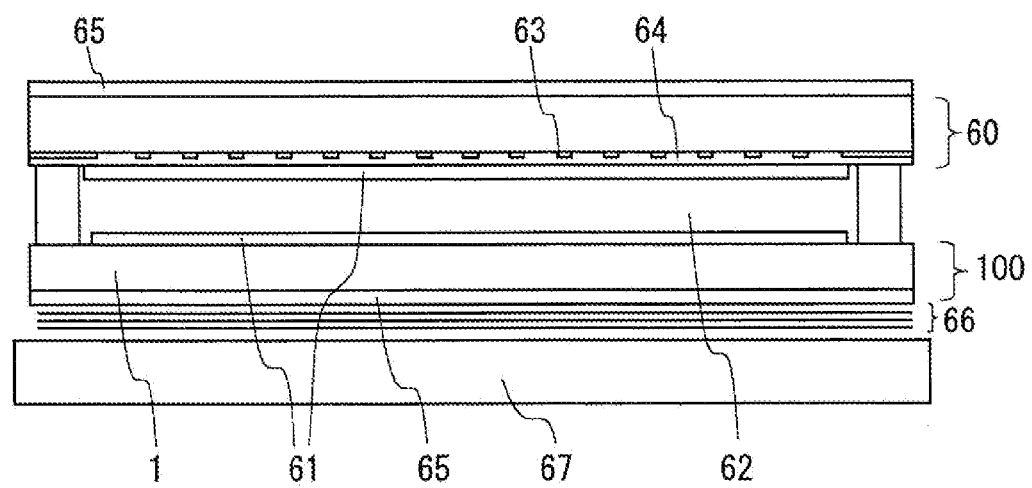

F I G . 3
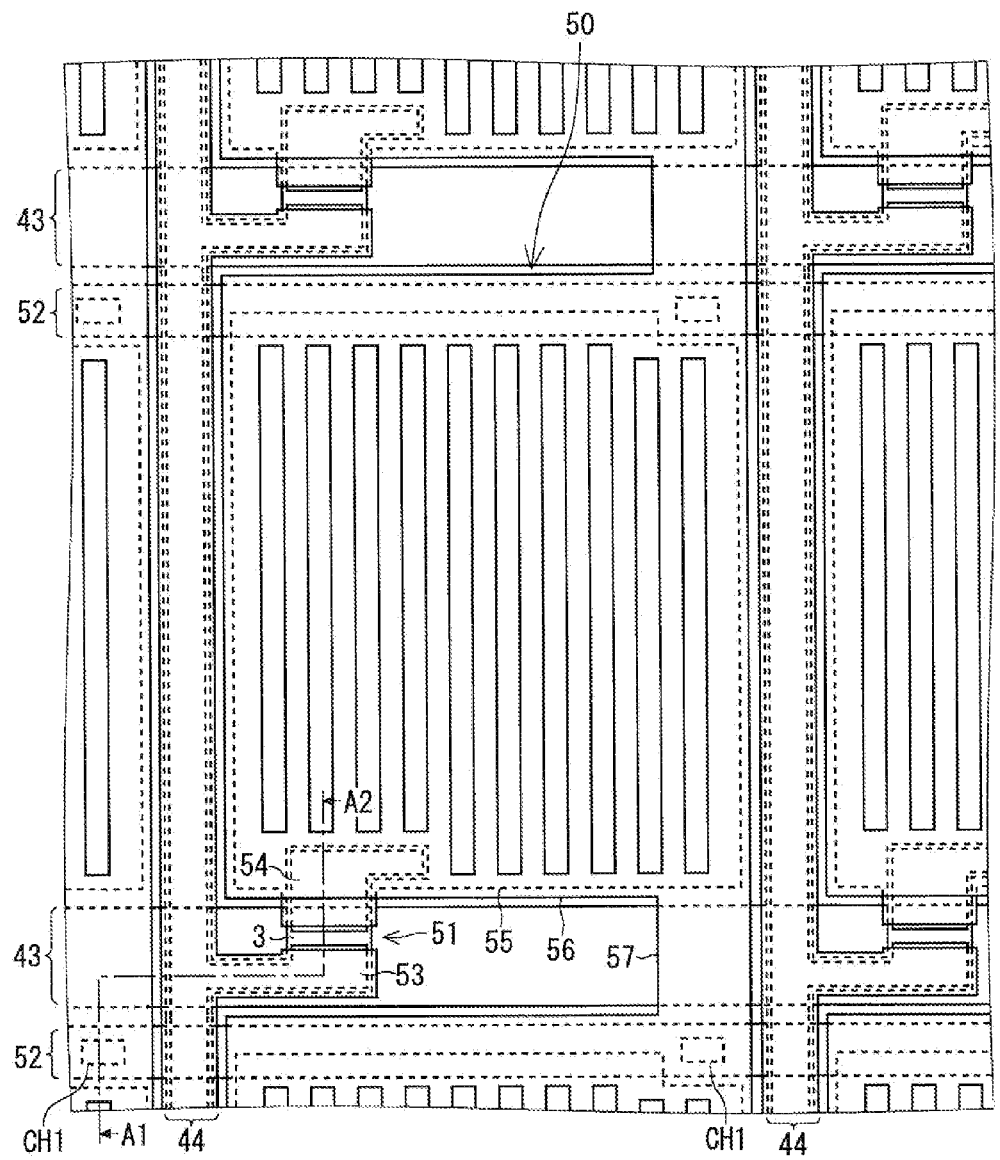

F I G. 6
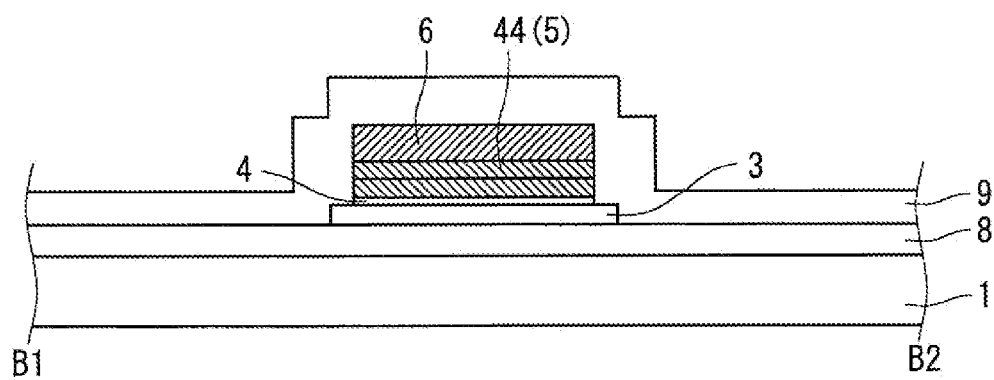

F I G. 2 1
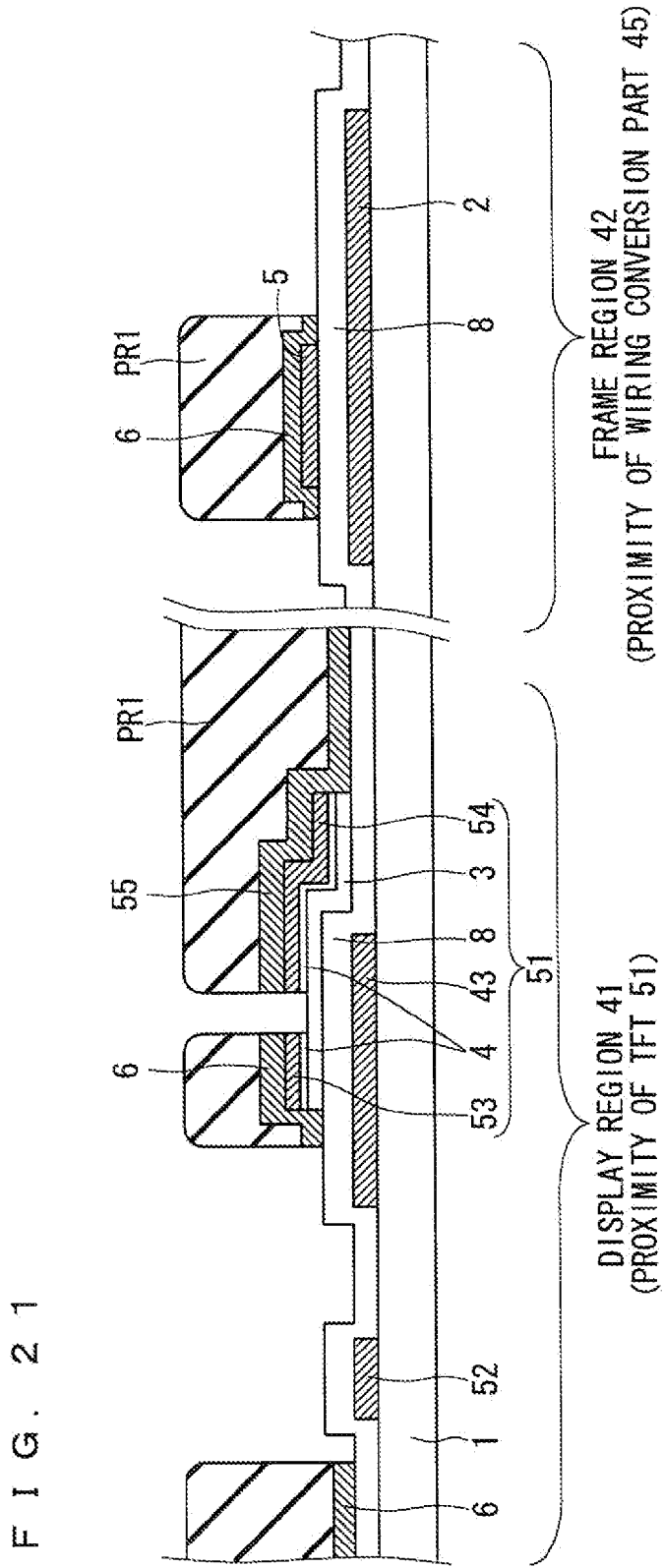

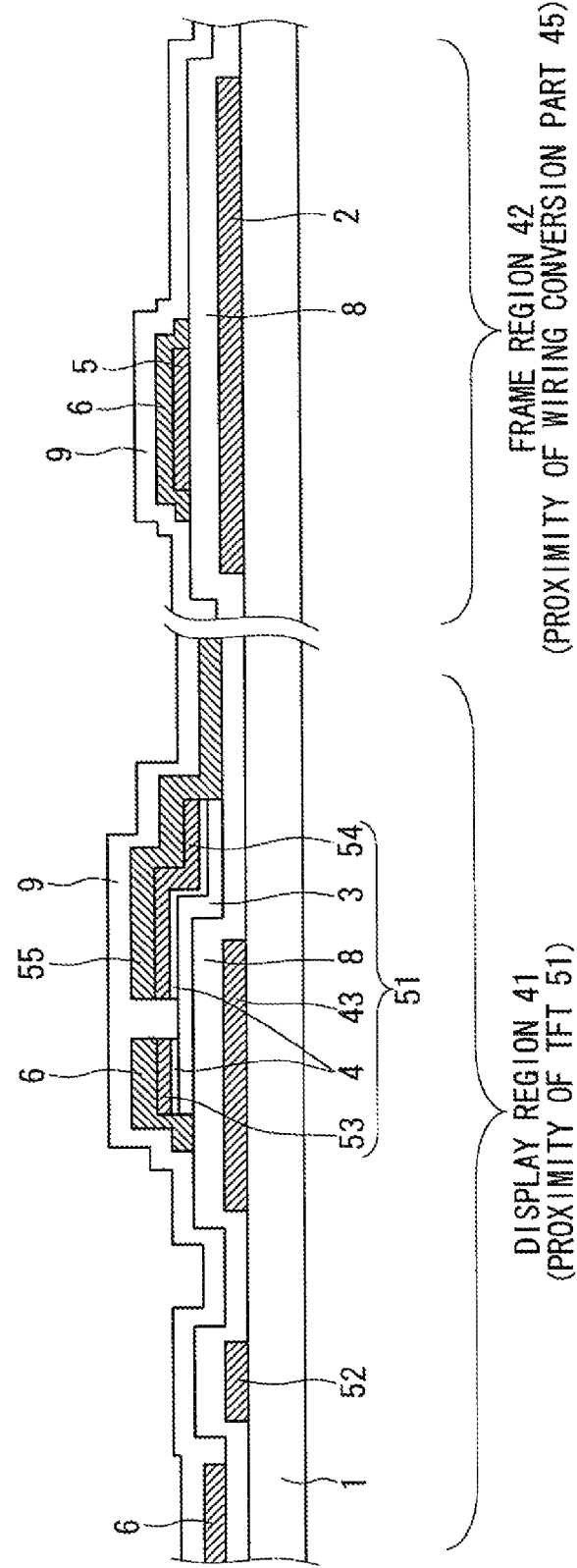
F I G. 22

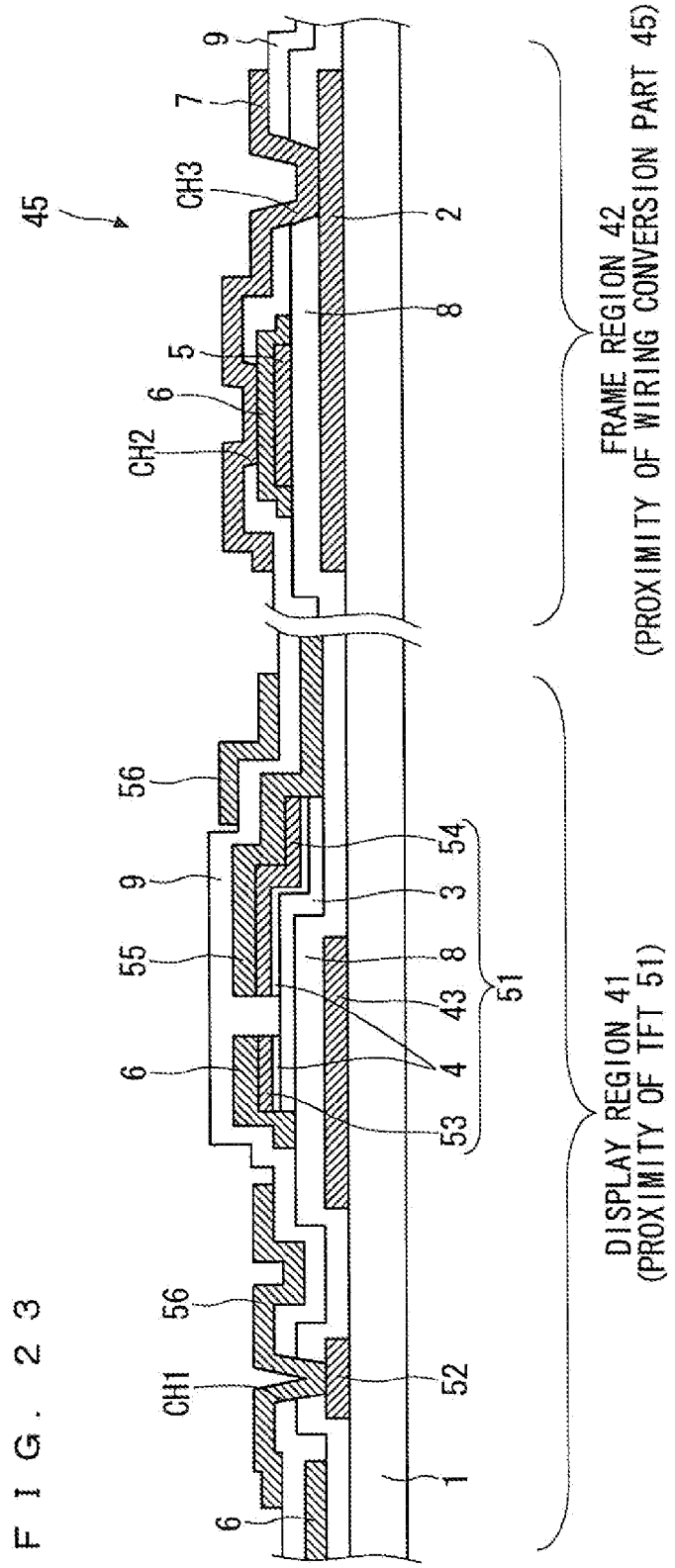

WIRING STRUCTURE, THIN FILM TRANSISTOR ARRAY SUBSTRATE INCLUDING THE SAME, AND DISPLAY DEVICE

BACKGROUND OF THE INVENTION

1. Field of the Invention

The present invention relates to a wiring structure including a wiring of a transparent conductive film, which is disposed, for example, on a display panel of a liquid crystal display device or the like.

2. Description of the Background Art

Recently, as a liquid crystal mode capable of achieving both characteristics of a wide viewing angle and high transmittance, adoption of an FFS (Fringe Field Switching) mode to a liquid crystal display device has been rapidly spread. An FFS mode TFT array substrate includes a structure in which two layers of transparent conductive films are overlapped with an insulating film therebetween, as shown, for example, in Japanese Patent No. 3826217. On the other hand, a transparent conductive film included in a general TN (Twisted Nematic) mode TFT array substrate is a single layer. Accordingly, the number of photoengraving steps required for manufacturing the FFS mode TFT array substrate is increased by at least one step compared to that of the general TN mode TFT array substrate.

As a measure against such increase in the number of steps, for example, Japanese Patent Application No. 2010-191410 discloses a technique of reducing the number of necessary photoengraving steps by devising the arrangement of a transparent conductive film pattern provided on the FFS mode TFT array substrate. The configuration of the FFS mode TFT array substrate disclosed in Japanese Patent Application No. 2010491410 can be formed by using the same number of photoengraving steps as that in the manufacture of the general TN mode TFT array substrate.

As described above, the FFS mode TFT array substrate includes a structure in which the two layers of transparent conductive films overlap with the insulating film interposed therebetween. In this case, a balance between stress generated in the lower transparent conductive film and stress generated in the insulating film thereabove may not be kept, and this may cause a phenomenon called "film floating" or "film peeling" (hereinafter, collectively referred to as "film floating") in which the insulating film of the upper layer is peeled at an end of the transparent conductive film or the like.

The frequency of occurrence of this film floating is associated with a pattern density of the transparent conductive film, and is increased on a region with a relatively sparse pattern density of the transparent conductive film, such as a frame region on the outside of a display region on the TFT array substrate, for example, an external connection terminal part, a wiring conversion part, or the like. The present inventor has confirmed that the film floating of the insulating film on the transparent conductive film tends to occur, particularly, on corners (protruding corner portions) of the pattern of the transparent conductive film. Since a function of the insulating film as a protective film is lost on the portion where the film floating of the insulating film occurs, the film floating leads to reduction in corrosion resistance of an electrode, occurrence of dielectric breakdown, or the like, which causes reduction in a yield on the manufacture of the TFT array substrate and reduction in reliability of the TFT array substrate. Accordingly, in order to obtain a TFT array substrate having a high yield and high reliability, it is effective to take a measure against the film floating of the insulating film.

In order that the number of photoengraving steps of the FFS mode TFT array substrate may be made identical to that of the general TN mode TFT array substrate, Japanese Patent Application No. 2010-191410 employs a configuration in which a transparent conductive film is arranged on a metal film pattern serving as a source wiring without an insulating film interposed therebetween. In this configuration, since the area of the transparent conductive film pattern on the TFT array substrate is large, and increase in the frequency of occurrence of the film floating of the insulating film is concerned, the measure against the film floating becomes further important.

Moreover, in the TFT array substrate of Japanese Patent Application No. 2010-191410, since the metal film and the transparent conductive film are required to function as the electrically same electrode or wiring, the electrical connection between the metal film and the transparent conductive film is important. For example, since excellent electrical connection cannot be easily obtained between a transparent electrode such as ITO (Indium Tin Oxide) and Al, a problem arises when an ITO transparent conductive film is required to be disposed on a laminated film having an Al-based metal as an uppermost layer. The present inventor has confirmed that in a liquid crystal display device employing a TFT array substrate having a wiring structure in which ITO is arranged on Al, the resistance of the wiring conversion part that connects both wirings on different layers of the TFT array substrate increases, and a display defect such as a line defect occurs.

On the other hand, since an Al-based thin film has a low resistance value the application of the Al-based thin film to a signal wiring of the TFT array substrate has become widespread with increase in resolution and increase in size of a screen of the liquid crystal display device. Therefore, in the development of the FFS mode TFT array substrate, it is important to improve the electrical connection between the transparent conductive film and the metal film, particularly, between the transparent conductive film and the laminated film having the Al-based thin film as the upper surface.

SUMMARY OF THE INVENTION

An object of the present invention is to provide a wiring structure capable of suppressing occurrence of film floating of an insulating film on a transparent conductive film, and obtaining excellent electrical connection between the transparent conductive film and a metal film, a TFT array substrate including the same, and a liquid crystal display device.

A wiring structure according to the present invention includes a first conductive film, and a first transparent conductive film formed on the first conductive film. The first transparent conductive film does not cover an end surface of said first conductive film in proximity to a corner of the first transparent conductive film, and has a portion covering the end surface of the first conductive film on a portion other than the proximity of the corner.

Concentration of stress on the corner of the first transparent conductive film is prevented, and occurrence of film floating of the insulating film provided on the first transparent conductive film can be suppressed. Further, on the portion other than the proximity of the corner of the first transparent conductive film, since the first transparent conductive film is connected to the end surface of the first conductive film, excellent electrical connection can be obtained by the other layer even when electrical connection between an uppermost layer of the first conductive film and the first transparent conductive film is poor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view showing the liquid crystal display device according to the preferred embodiment of the present invention;

FIG. 3 is a plan view of a display region of the TFT array substrate according to the preferred embodiment of the present invention;

FIG. 6 is a sectional view of an extending portion of a source wiring of the TFT array substrate according to the first preferred embodiment;

FIG. 18 to FIG. 23 are process diagrams for illustrating a method of manufacturing the TFT array substrate according to the second preferred embodiment.

DESCRIPTION OF THE PREFERRED EMBODIMENTS

Figure 1:
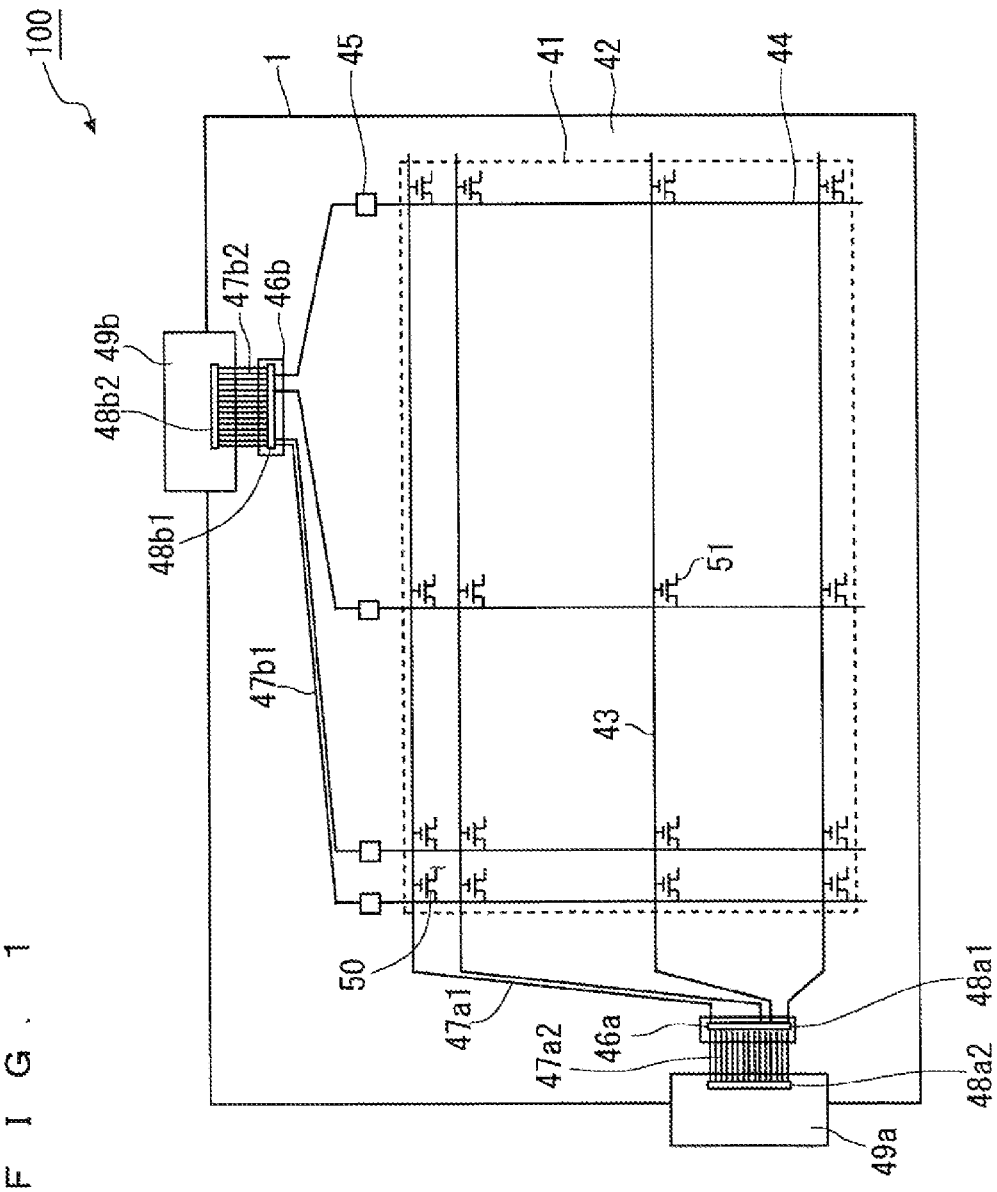
FIG. 1 is a plan view showing a configuration of a TFT array substrate employed in a liquid crystal display device according to a preferred embodiment of the present invention.

Preferred embodiments of the present invention will be hereinafter described, but the application of the present invention is not limited thereto. For the convenience of explanation, the description of explanation and the drawings are appropriately omitted or simplified. For example, the drawings are schematically represented, and do not specify precise dimensions and the like of constituent elements shown therein. Additionally, elements denoted by the same reference numerals in respective figures show respective similar elements, and explanation of these elements will not be repeated.

First Preferred Embodiment

First, a configuration example of a liquid crystal display device capable of applying a wiring structure according to the present invention is shown. FIG. 1 is a plan view showing a TFT array substrate 100 configuring the liquid crystal display device according to a preferred embodiment of the present invention. As shown in FIG. 1, the TFT array substrate 100 includes pixels 50 serving as units of display of an image, which are disposed on a substrate 1 in a form of an array (matrix). Each pixel 50 is provided with a TFT 51 serving as a switching element that supplies a display voltage to a pixel electrode (not shown). A member formed from the substrate 1 equipped with the TFTs 51 is called a "TFT array substrate" since the TFTs 51 are arranged for the respective pixels 50 in the form of an array. The substrate 1 is configured, for example, by a glass substrate or a semiconductor substrate.

The TFT array substrate 100 includes an array region 41 (region inside a rectangle shown by a dotted line in FIG. 1) which is a region where the TFTs 51 are arranged in the form of an array, and a frame region 42 (region outside the rectangle shown by the dotted line in FIG. 1) surrounding the array region 41. In the liquid crystal display device, the array region 41 corresponds to a display region that is a region where an image is displayed. Hereinafter, the array region 41 is referred to as a "display region 41".

In the display region 41 of the TFT array substrate 100, a plurality of gate wirings (scanning signal lines) 43 and a plurality of source wirings (display signal lines) 44 are provided. The plurality of gate wirings 43 extend parallel to each other, and similarly, the plurality of source wirings 44 extend parallel to each other. The gate wirings 43 and the source wirings 44 are disposed so as to intersect with each other. Regions surrounded by pairs of adjacent gate wirings 43 and pairs of adjacent source wirings 44 respectively form pixels 50. Accordingly, in the display region 41, the pixels 50 are arranged in a form of a matrix.

In the frame region 42 of the TFT array substrate 100, a scanning signal drive circuit 46a, a display signal drive circuit 46b, wiring conversion parts 45, lead-out wirings 47a1, 47a2, 47b1, and 47b2, external connection terminals 48a1, 48a2, 48b1, and 48b2, and the like are disposed.

The gate wirings 43 extend up to the frame region 42 on the outside of the display region 41, and are led out to an end of the TFT array substrate 100 by the lead-out wirings 47a1 formed by the same wiring layer (first or lower layer conductive films) as the gate wirings 43. The gate wirings 43 led out by the lead-out wirings 47a1 are connected to the scanning signal drive circuit 46a through the external connection terminal 48a1.

The source wirings 44 extend up to the frame region 42 on the outside of the display region 41, are electrically connected to the lead-out wirings 47b1 formed by the same wiring layer (first conductive films) as the gate wirings 43 at the wiring conversion parts 45, and are led out to an end of the TFT array substrate 100 by the lead-out wirings 47b1. The source wirings 44 led out by the lead-out wirings 47b1 are connected to the display signal drive circuit 46b through the external connection terminal 48b1.

An external wiring 49a is disposed in proximity to the scanning signal drive circuit 46a, and the scanning signal drive circuit 46a and the external wiring 49a are connected to each other through the lead-out wirings 47a2 and the external connection terminal 48a2. An external wiring 49b is disposed in proximity to the display signal drive circuit 46b, and the display signal drive circuit 46b and the extern1 wiring 49b are connected to each other through the lead-out wirings 47b2 and the external connection terminal 48b2. The external wirings 49a and 49b are circuit boards, for example, such as FPC (Flexible Printed Circuit).

Various signals from the outside are supplied to the scanning signal drive circuit 46a through the external wiring 49a and the lead-out wirings 47a2. Various signals from the outside are supplied to the display signal drive circuit 46b through the external wiring 49b and the lead-out wirings 47b2.

The scanning signal drive circuit 46a supplies a gate signal (scanning signal) to the gate wirings 43 based on a control signal supplied from the outside. This gate signal is a signal that sequentially selects each of the gate wirings 43. The display signal drive circuit 46b supplies a display signal to each of the source wirings 44 in synchronization with the timing of selection of each gate wiring 43 based on the control signal and display data supplied from the outside. A display voltage in response to the display data is supplied to each of the pixels 50 by this action.

Each of the pixels 50 is provided with at least one TFT 51. The TFT 51 is arranged in proximity to an intersection of the source wiring 44 and the gate wiring 43, and a gate electrode and a source electrode of the TFT 51 are connected to the gate wiring 43 and the source wiring 44, respectively. The TFT 51 is turned on in response to the gate signal supplied from the gate wiring 43, and a display potential supplied from the source wiring 44 is applied to the pixel electrode connected to a drain electrode.

On the FFS mode TFT array substrate 100, there are disposed not only the pixel electrodes but also the counter electrodes (common electrodes) arranged so as to be opposed to the pixel electrodes with insulating films interposed therebetween. Generally, the pixel electrodes have a flat plate form, and the common electrodes have an interdigital shape (shape having a plurality of slits). The counter electrodes are subjected to a common potential, and fringing fields in response to the display voltage (difference between a display potential and a common potential) occur between the pixel electrodes and the counter electrodes. A configuration of the pixel 50 will be later described in detail.

Next, an overall configuration of the liquid crystal display device according to a first preferred embodiment will be described. FIG. 2 is a sectional view showing the overall configuration of the liquid crystal display device including the TFT array substrate 100 described above. As shown in FIG. 2, the liquid crystal display device has a structure in which a liquid crystal layer 62 is sealed between the TFT array substrate 100 and a counter substrate 60 arranged opposed to each other.

The counter substrate 60 is arranged on a front surface side (viewing side) of the liquid crystal display device with respect to the TFT array substrate 100. The counter substrate 60 is provided with a color filter 64, black matrices (BM) 63, and the like. The counter substrate 60 is generally called a "color filter substrate".

Oriented films 61 are formed on respective surfaces, of the TFT array substrate 100 and the counter substrate 60, facing the liquid crystal layer 62. Polarizing plates 65 are respectively provided on a back surface side (opposite viewing side) of the TFT array substrate 100 and a front surface side of the counter substrate 60. A liquid crystal display panel is configured by the TFT array substrate 100, the counter substrates 60, the liquid crystal layer 62, and the polarizing plates 65.

Further, a backlight unit 67 is arranged on a back surface side of the liquid crystal display panel with optical films 66 such as retardation films interposed therebetween, and the liquid crystal display device is configured by housing these components in a frame (not shown) made of resin, metal, or the like.

Light that passed through the polarizing plate 65 and became linearly polarized light has its polarization state changed by the liquid crystal layer 62. In an FFS mode liquid crystal display device, the liquid crystal layer 62 is driven (an orientation direction of the liquid crystal layer 62 is changed) by fringing fields occurring between the pixel electrodes and the counter electrodes of the TFT array substrate 100, thereby changing the polarization state of light that passes through the liquid crystal layer 62.

More specifically, light from the backlight unit 67 becomes linearly polarized light by the polarizing plate 65 on the back surface side of the liquid crystal display panel. This linearly polarized light has its polarization state changed by passing through the liquid crystal layer 62, whereby the amount of light passing through the polarizing plate 65 on a front surface side of the liquid crystal display panel is changed. That is, among transmitted light emitted from the backlight unit 67 and transmitted through the liquid crystal display panel, the amount of the light passing through the polarizing plate 65 on the front surface side is changed. The orientation direction of the liquid crystal layer 62 is changed by an applied display voltage. Accordingly, the amount of the light passing through the polarizing plate 65 on the front surface side can be changed by controlling the display voltage. Therefore, a desirable image can be displayed by changing the display voltage for each pixel 50.

Figure 4:
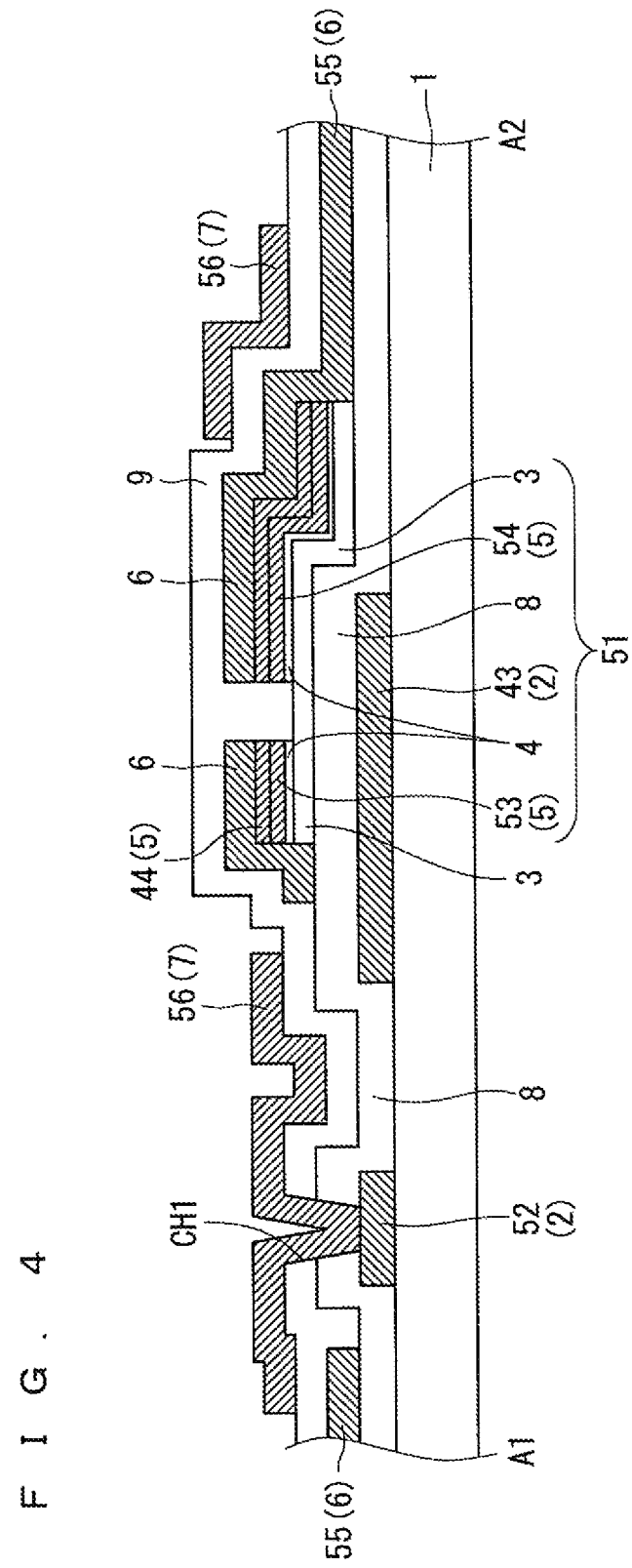
FIG. 4 is a sectional view of the display region of the TFT array substrate according to the preferred embodiment of the present invention.

Next, a detailed configuration of the display region 41 of the TFT array substrate 100 according to the first preferred embodiment will be described with reference to FIG. 3 and FIG. 4. FIG. 3 is a plan view of the pixel 50 located in proximity to a central part of the display region 41 of the TFT array substrate 100, and FIG. 4 is a sectional view taken along line A1-A2 in FIG. 3. Note that configuration of the pixel 50 is similar to that shown in FIG. 3 and FIG. 4 except for the pixel located on an outermost periphery of the display region 41.

A plurality of gate wirings 43 connected to the gate electrodes of the TFTs 51 are formed on the substrate 1 made of an insulating material such as a glass substrate, for example. In the present preferred embodiment, a part of each gate wiring 43 functions as the gate electrode of the TFT 51. The plurality of gate wirings 43 are linearly disposed parallel to each other. On the substrate 1, a plurality of common wirings 52 formed by using the same wiring layer (first conductive films 2) as the gate wirings 43 are formed parallel to each other. The common wirings 52 are disposed between the gate wirings 43 substantially parallel to the gate wirings 43.

The first conductive films 2 configuring these gate wirings 43 (gate electrodes) and common wirings 52 are formed, for example, by high melting point metals or low resistance metals such as Cr, Al, Ta, Ti, Mo, W, Ni, Cu, Au, Ag, an alloy film mainly composed of these metals, or a laminated film of these metals.

A first insulating film 8 is formed on the gate wirings 43 and the common wirings 52. Parts of the first insulating films 8 (portions on the gate wirings 43) each functions as a gate insulating film of the TFT 51.

Semiconductor films 3 are formed on the first insulating film 8. In the present preferred embodiment, the semiconductor films 3 are formed in the form of straight lines intersecting with the gate wirings 43 to coincide with formation regions of the source wirings 44 (patterns of the semiconductor films 3 are orthogonal to the gate wirings 43 in FIG. 3). The semiconductor film 3 is formed by noncrystalline silicon, polycrystalline silicon, or the like.

The linear semiconductor film 3 functions as a redundant wiring of the source wiring 44. That is, even when the source wiring 44 is disconnected, interruption of electrical signals is prevented since the semiconductor film 3 is disposed along the source wiring 44.

The semiconductor film 3 is partially branched on a portion intersecting with the gate wiring 43, extends along the gate wiring 43, and further extends into the pixel 50. The TFT 51 is formed by using a portion of the semiconductor film 3 branched from the portion intersecting with the gate wiring 43. That is, a portion overlapping with the gate wiring 43 (gate electrode) among the branched semiconductor film 3 serves as an active region configuring the TFT 51.

An ohmic contact film 4 doped with conductive impurities is formed on the semiconductor film 3. Although the ohmic contact film 4 is formed substantially on an entire surface of the semiconductor film 3, the ohmic contact film 4 is removed above a portion serving as a channel region of the TFT 51 (region between the source wiring 44 and drain electrode 54). The ohmic contact film 4 is formed, for example, by n-type noncrystalline silicon or n-type polycrystalline silicon doped with impurities such as phosphorus (P) at high concentration.

Among the portion of the semiconductor film 3 overlapping with the gate wiring 43, a region in which the ohmic contact film 4 is formed serves as a source/drain region. With reference to FIG. 4, in the semiconductor film 3, a region, overlapping with the gate wiring 43, below the left ohmic contact film 4 serves as a source region, and a region, overlapping with the gate wiring 43, below the right ohmic contact film 4 serves as a drain region. A region, interposed between the source region and the drain region, of the semiconductor film 3 serves as a channel region.

The source wiring 44, the source electrode 53, and the drain electrode 54 are formed on the ohmic contact film 4 by using the same wiring layer (second or upper layer conductive films 5). Specifically, the source electrode 53 is formed on the ohmic contact film 4 on the source region side of the TFT 51, and the drain electrode 54 is formed on the ohmic contact film 4 on the drain region side. The TFT 51 having such a configuration is called a "channel etching type TFT".

The source wiring 44 is formed on the semiconductor film 3 with the ohmic contact film 4 interposed therebetween, and disposed so as to linearly extend in a direction in which the source wiring 44 intersect with the gate wiring 43, Although the source electrode 53 and the drain electrode 54 are separated, the source electrode 53 and the source wiring 44 are connected. That is, the source wiring 44 is branched on the portion intersecting with the gate wiring 43 and extends along the gate wiring 43, and an extended portion serves as the source electrode 53. Although the second conductive film 5 configuring the source wiring 44, the source electrode 53, and the drain electrode 54 is formed substantially on an entire surface of the semiconductor film 3 similarly to the ohmic contact film 4, the second conductive film 5 is removed above the portion serving as the channel region of the TFT 51.

In the present preferred embodiment, the second conductive film 5 configuring the source wiring 44, the source electrode 53, and the drain electrode 54 is a laminated film including an upper layer which is a metal film mainly composed of Al, and a lower layer of high melting point metals or low resistance metals such as Cr, Ta, Ti, Mo, W, Ni, Cu, Au, Ag, or an alloy film mainly composed of these metals.

As can be seen from the above description, the semiconductor film 3 is disposed substantially on an entire region below the source wiring 44, the source electrode 53, and the drain electrode 54, and the region between the source electrode 53 and the drain electrode 54 located on the gate wiring 43. The ohmic contact film 4 is disposed between the source wiring 44, the source electrode 53 and the semiconductor film 3, and between the drain electrode 54 and the semiconductor film 3.

The drain electrode 54 is electrically connected to the pixel electrode 55 that is a first transparent conductive film 6 formed substantially on an entire surface of a region of the pixel 50 (region surrounded by the source wirings 44 and the gate wirings 43). The first transparent conductive film 6 is formed by a transparent conductive film such as ITO.

As shown in FIG. 4, the pixel electrode 55 has a portion directly overlapped on the drain electrode 54. That is, on the portion, a lower surface of the first transparent conductive film 6 configuring the pixel electrode 55 is in direct contact with an upper surface of the drain electrode 54. The first transparent conductive film 6 covers a substantially entire surface of the drain electrode 54. However, an end of the first transparent conductive film 6 on the channel region side is arranged substantially on the same position as an end of the drain electrode 54 on the channel region side or arranged slightly backward from the end of the drain electrode 54. Therefore, an end surface of the drain electrode 54 on the channel region side is not covered with the first transparent conductive film 6. Note that the first transparent conductive film 6 is formed so as to cover the end surface of the drain electrode 54 other than the end surface on the channel region.

Being "formed so as to cover an end surface" herein means forming an upper layer film so as to equally cover an upper surface and an end surface of a lower layer film, and also includes, for example, a state where the upper layer film cannot sufficiently come into contact with the end surface of the lower layer film due to irregularities of the end surface of the lower layer film (a state of so-called "coverage failure"). However, it does not include a state where, after fowling the upper layer film so as to cover the lower layer film, the end surface of the lower layer film is intentionally exposed by processing the upper layer film.

Thus, by employing a configuration in which the pixel electrode 55 is partially directly overlapped with the drain electrode 54 without an insulating film interposed therebetween, contact holes for electrically connecting the pixel electrode 55 and the drain electrode 54 are not required, and the number of photoengraving steps can be reduced. Additionally, since it is not necessary to ensure areas for arranging the contact holes, this configuration also has an advantage of increasing an aperture ratio of each pixel 50.

The first transparent conductive film 6 that is the same wiring layer as the pixel electrode 55 is formed so as to also directly overlap on a substantially entire surface of the source electrode 53 and the source wiring 44. The end of the first transparent conductive film 6 on the channel region side on the source electrode 53 is arranged substantially on the same position as the end of the source electrode 53 on the channel region side or arranged slightly backward from the end of the source electrode 53. Therefore, the end of the source electrode 53 on the channel region side is not covered with the first transparent conductive film 6. Note that the first transparent conductive film 6 is formed so as to cover the end surface of the source electrode 53 other than the end surface on the channel region.

The first transparent conductive film 6 on the source electrode 53 and the first transparent conductive film 6 (pixel electrode 55) on the drain electrode 54 are spaced apart. That is, the first transparent conductive film 6 is not provided on the channel region of the semiconductor film 3.

As shown in FIG. 4, the source wiring 44 is formed by using the second conductive film 5 which is the same wiring layer as the source electrode 53 and the drain electrode 54. The semiconductor film 3 is disposed substantially on the entire surface below the source wiring 44, and the ohmic contact film 4 is formed between the source wiring 44 and the semiconductor film 3.

The source wiring 44, the ohmic contact film 4, and the semiconductor film 3 is covered by the first transparent conductive film 6 which is the same layer as the pixel electrode 55, and the first transparent conductive film 6 protrudes from the width of the source wiring 44 to cover the end surface of the source wiring 44. Although FIG. 4 shows only one end surface (left end surface) of the source wiring 44, the other end surface thereof is also covered by the first transparent conductive film 6 protruding from the width of the source wiring 44.

Thus, the first transparent conductive film 6 that is the same layer as the pixel electrode 55 is formed substantially on the entire surface of the source wiring 44, the source electrode 53, and the drain electrode 54, which are formed by using the second conductive film 5. Particularly, the first transparent conductive film 6 on the source wiring 44 also functions as the redundant wiring of the source wiring 44. That is even when the source wiring 44 is disconnected, interruption of electrical signals is prevented since the first transparent conductive film 6 is disposed along the source wiring 44.

As shown in FIG. 4, the first transparent conductive film 6 including the pixel electrode 55 is covered with a second insulating film 9. Counter electrode 56 as the second transparent conductive film 7 is formed on the second insulating film 9. The second insulating film 9 functions as a protective film of the TFT 51, and also functions as an interlayer dielectric film between the pixel electrode 55 and the counter electrode 56. The second insulating film 9 is formed by an insulating film such as silicon nitride or silicon oxide, a coating type insulating film (formed by coating), or a laminated film thereof.

The counter electrode 56 is arranged so as to be opposed to the pixel electrode 55 with the second insulating film 9 interposed therebetween, and is provided with slits for generating a fringing field between the counter electrode 56 and the pixel electrode 55. As shown in. FIG. 3, a plurality of slits of the counter electrodes 56 are provided substantially parallel to the source wirings 44. In other words, the counter electrode 56 has an interdigital shape by the presence of the slits, As described above, in the FFS mode liquid crystal display device, liquid crystal is driven by the fringing field generated between the pixel electrode 55 and the counter electrode 56.

The counter electrode 56 is electrically connected to the common wiring 52, to which a common potential is supplied, through a contact hole CH1 penetrating through the second insulating film 9 and the first insulating film 8. The counter electrode 56 is integrally formed so as to be connected with another counter electrode 56 of the adjacent pixel 50 with the gate wiring 43 therebetween. That is, the counter electrodes 56 of the adjacent pixels 50 with the gate wiring 43 therebetween are coupled by a counter electrode coupling part 57 that is the same wiring layer (second transparent conductive film 7) as the counter electrodes 56. Herein, the counter electrode coupling part 57 is formed so as to bridge over the gate wiring 43 on a region not overlapping with the source wiring 44 and the TFT 51, That is the second transparent conductive film 7 is formed so as to be partially overlapped with the gate wiring 43.

Figure 5:
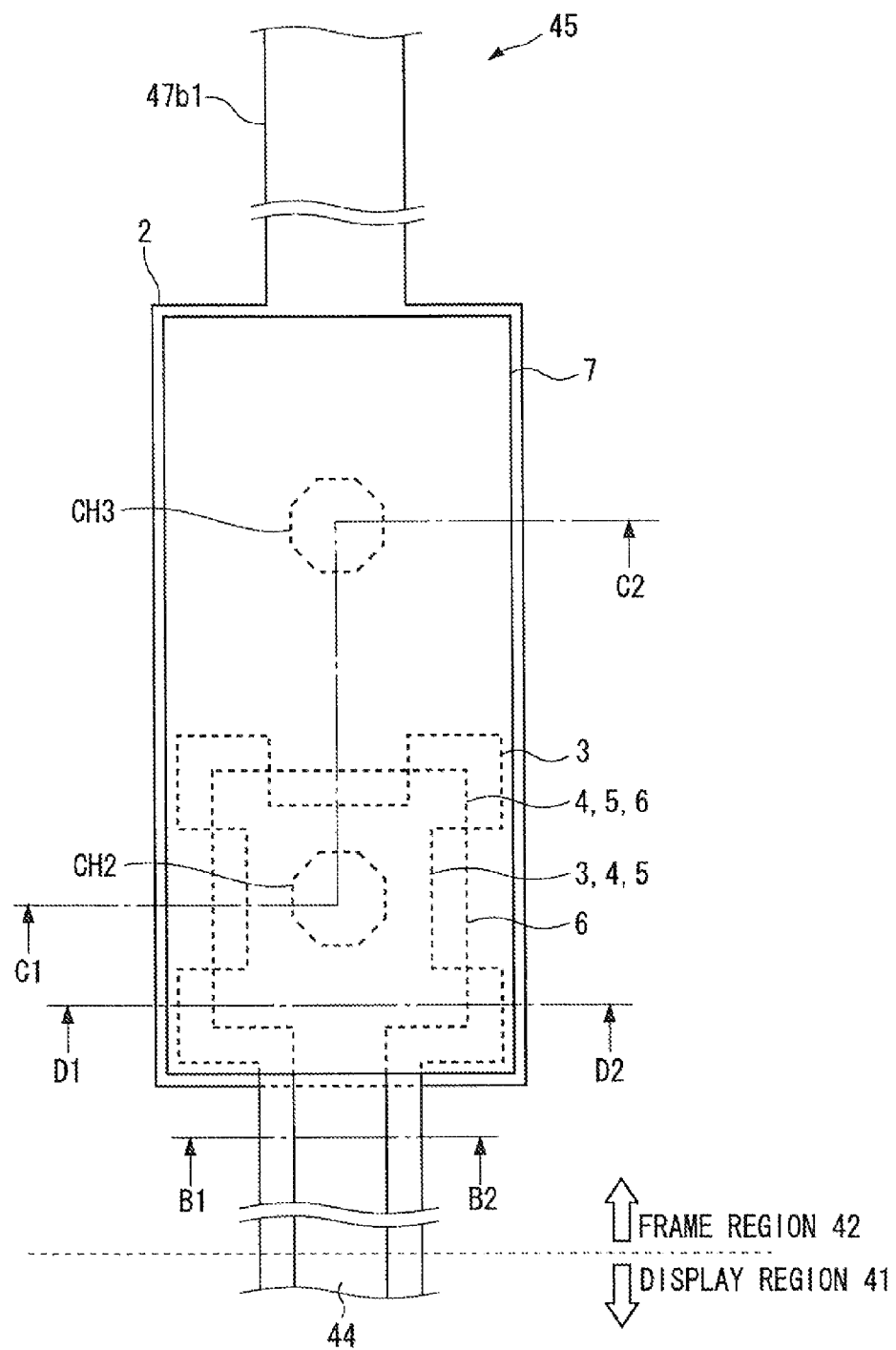
FIG. 5 is a plan view of a wiring conversion part of a TFT array substrate according to a first preferred embodiment.
Figure 7:
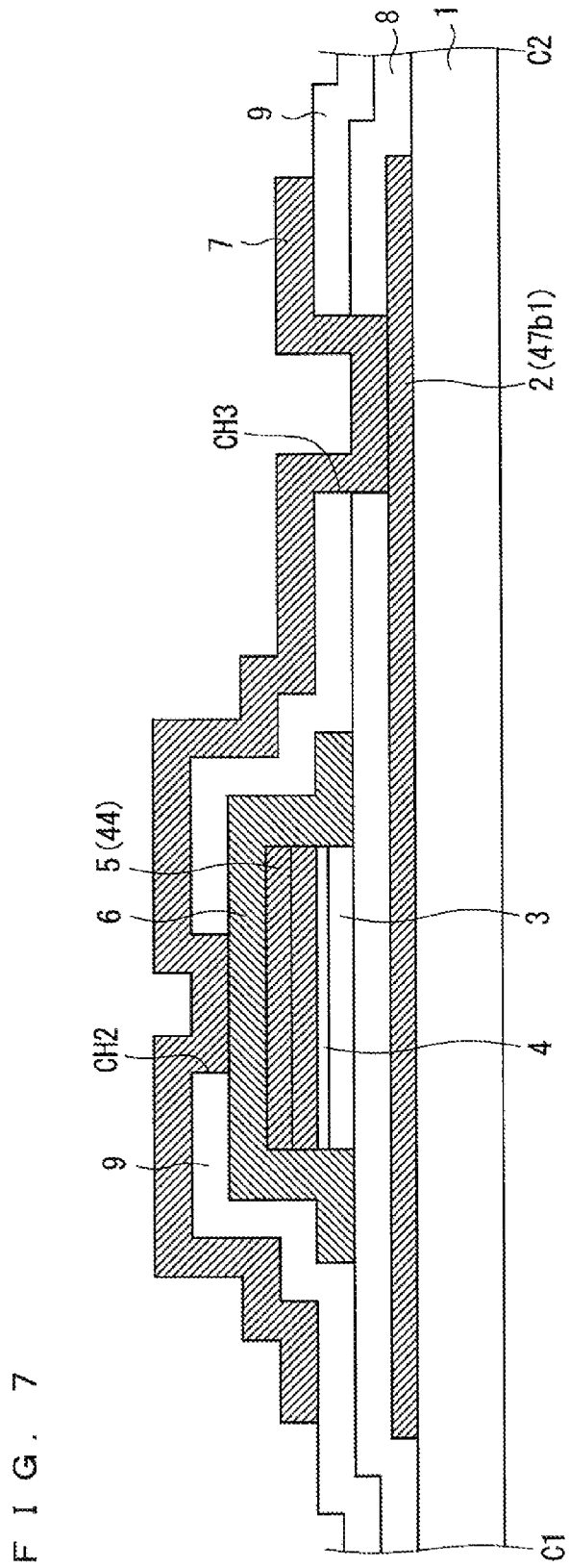
FIG. 7 and FIG. 8 are sectional views of a wiring conversion part of the TFT array substrate according to the first preferred embodiment.
Figure 8:
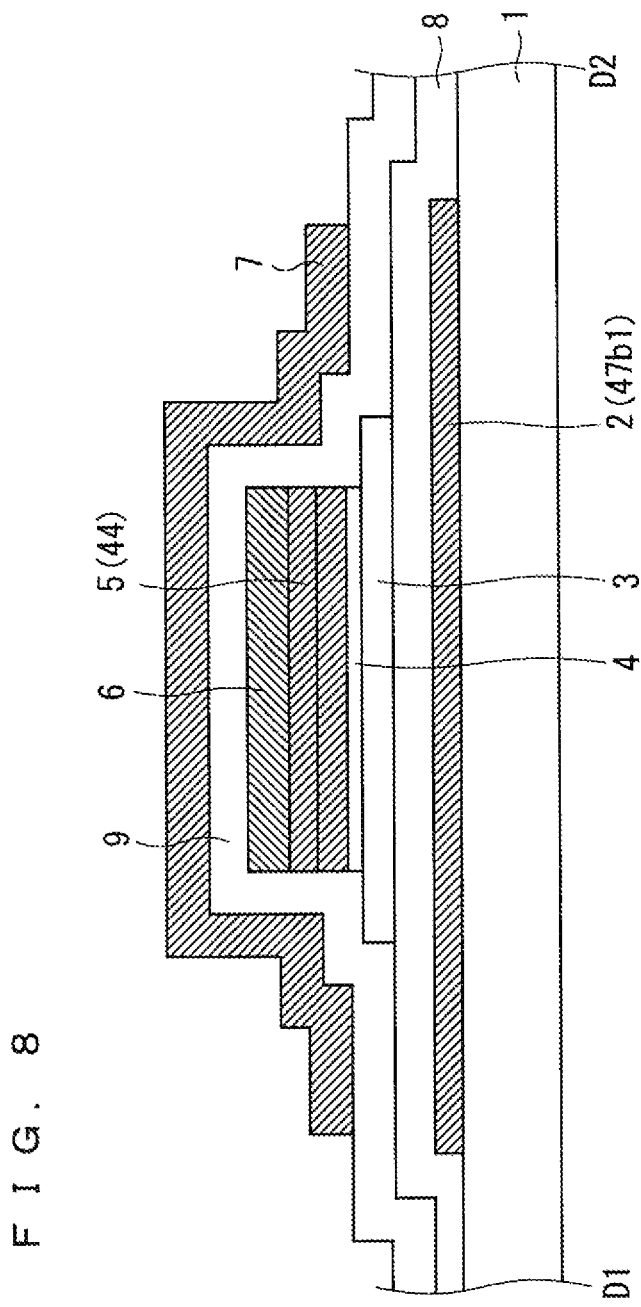

Next, a configuration of the wiring conversion part 45 provided on the TFT array substrate 100 of the liquid crystal display device according to the first preferred embodiment will be described with reference to FIG. 5 to FIG. 8. FIG. 5 is a plan view of the wiring conversion part 45, FIG. 6 is a sectional view taken along line B1-B2 in FIG. 5, FIG. 7 is a sectional view taken along line C1-C2 in FIG. 5, and FIG. 8 is a sectional view taken along line D1-D2 in FIG. 5.

In FIG. 5 to FIG. 8, elements formed by using the same layer as shown in FIG. 3 and FIG. 4 are denoted by the same reference numerals. For example, the first conductive film 2 of FIG. 5 to FIG. 8 is the same layer as the first conductive film 2 of FIG. 4, which is the gate wiring 43. Similarly, the first insulating film 8 of FIG. 5 to FIG. 8 is the same layer as the first insulating film 8 of FIG. 4 serving as the gate insulating film of the TFT 51. Further, the semiconductor film 3 of FIG. 5 to FIG. 8 is the same layer as the semiconductor film 3 of FIG. 4, which is the active region of the TFT 51. Other elements such as the ohmic contact film 4, the second conductive film 5, the first transparent conductive film 6, the second transparent conductive film 7, and the second insulating film 9 are also the same.

As shown in FIG. 5, the wiring conversion part 45 is disposed in the frame region 42 of the TFT array substrate 100. The lead-out wiring 47b1 connected to the display signal drive circuit 46b or the external wiring 49b is formed by the first conductive film 2 which is the same layer as the gate wiring 43, and is drawn into the wiring conversion part 45. An extending portion of the source wiring 44 which is the second conductive film 5 is drawn from the display region 41 to the wiring conversion part 45.

As shown in FIG. 6, on the extending portion of the source wiring 44, the ohmic contact film 4 and the semiconductor film 3 are formed on a lower surface of the source wiring 44 (second conductive film 5), and the first transparent conductive film 6 which is the same layer as the pixel electrode 55 is formed on an upper surface of the second conductive film 5. The semiconductor film 3, the ohmic contact film 4, the second conductive film 5, and the first transparent conductive film 6 are stacked on the first insulating film 8.

Ends of the ohmic contact film 4, the second conductive film 5, the first transparent conductive film 6 are arranged substantially on the same position, and the ends are arranged further inside the end of the semiconductor film 3. That is, the ohmic contact film 4, the second conductive film 5, and the first transparent conductive film 6 are formed to have slightly narrower widths than the semiconductor film 3. Accordingly, the end surfaces of the semiconductor film 3, the ohmic contact film 4, and the second conductive film 5 are not covered with the first transparent conductive film 6.

On the extending portion of the source wiring 44, the second insulating film 9 is formed on the first transparent conductive film 6. The second insulating film 9 is formed so as to cover the end surfaces of the semiconductor film 3, the ohmic contact film 4, the second conductive film 5, and the first transparent conductive film 6.

Next, a configuration of the wiring conversion part 45 connecting the lead-out wiring 47b1 as the first conductive film 2 and the extending portion of the source wiring 44 as the second conductive film 5 will be described.

As shown in FIG. 7 and FIG. 8, the first conductive film 2 as the lead-out wiring 47b1 is drawn into the wiring conversion part 45. The first insulating film 8 is formed on the first conductive film 2.

The source wiring 44 having a structure shown in FIG. 6 is also drawn onto the first insulating film 8 located on the wiring conversion part 45. That is, on the wiring conversion part 45, a laminated structure of the semiconductor film 3, the ohmic contact film 4, the second conductive film 5, and the first transparent conductive film 6 is formed on the first insulating film 8.

The laminated structure has a portion where the end surfaces of the semiconductor film 3, the ohmic contact film 4, and the second conductive film 5 are covered with the first transparent conductive film 6 as shown in FIG. 7, and a portion where the end surfaces of the semiconductor film 3, the ohmic contact film 4, and the second conductive film 5 are not covered with the first transparent conductive film 6 as shown in FIG. 8. As can be seen from FIG. 5, the portions in which the end surfaces of the semiconductor film 3, the ohmic contact film 4, and the second conductive film 5 are not covered with the first transparent conductive film 6 are disposed in proximity to the corners (protruding corner portions)

of a pattern of the first transparent conductive film 6, and the portions in which the end surfaces of the semiconductor film 3, the ohmic contact film 4, and the second conductive film 5 are covered with the first transparent conductive film 6 are disposed on portions other than the corners of the pattern of the first transparent conductive film 6.

More specifically, in proximity to the corners of the first transparent conductive film 6, as shown in FIG. 8, the ends of the ohmic contact film 4, the second conductive film 5, and the first transparent conductive film 6 recede further inside the end of the semiconductor film 3. In other words, the portions in proximity to the corners of the ohmic contact film 4, the second conductive film 5, and the first transparent conductive film 6 are included in the semiconductor film 3 in plan view. In the proximity of the corners of the first transparent conductive film 6, the respective ends of the ohmic contact film 4, the second conductive film 5, and the first transparent conductive film 6 are arranged substantially on the same position. Therefore, the respective end surfaces of the semiconductor film 3, the ohmic contact film 4, and the second conductive film 5 are not covered with the first transparent conductive film 6.

On the other hand, on portions other than the proximity of the corners of the first transparent conductive film 6, as shown in FIG. 7, the end of the first transparent conductive film 6 is located further outside the ends of the semiconductor film 3, the ohmic contact film 4, and the second conductive film 5, In other words, the ends other than the proximity of the corners of the semiconductor film 3, the ohmic contact film 4, and the second conductive film 5 are included in the first transparent conductive film 6 in plan view. On the portions other than the proximity of the corners of the first transparent conductive film 6, respective ends of the semiconductor film 3, the ohmic contact film 4, and the second conductive film 5 are located substantially on the same position. Accordingly, the respective end surfaces of the semiconductor film 3, the ohmic contact film 4, and the second conductive film 5 are covered by the first transparent conductive film 6.

Also on the wiring conversion part 45, the second insulating film 9 is formed as an upper layer of the first transparent conductive film 6. As shown in FIG. 8, on the portions in the proximity of the corners of the first transparent conductive film 6, the second insulating film 9 is formed so as to directly cover the end surfaces of the semiconductor film 3, the ohmic contact film 4, the second conductive film 5, and the first transparent conductive film 6.

On the wiring conversion part 45, the second insulating film 9 is provided with a contact hole CH2 reaching the first transparent conductive film 6. Moreover, the first insulating film 8 and the second insulating film 9 are provided with a contact hole CH3 reaching the first conductive film 2.

Then, the second transparent conductive film 7 which is the same layer as the counter electrode 56 is formed on the second insulating film 9 so as to bridge over the contact hole CH2 and the contact hole CH3. The second transparent conductive film 7 is connected to the first transparent conductive film 6 through the contact hole CH2, and connected to the first conductive film 2 through the contact hole CH3. The first conductive film 2 and the first transparent conductive film 6 are electrically connected by the second transparent conductive film 7. As a result, the lead-out wiring 47b1 as the first conductive film 2 and the source wiring 44 as the second conductive film 5 are electrically connected.

As described above, the wiring conversion parts 45 of the first preferred embodiment are configured by two-layer transparent conductive films. Since the FFS mode TFT array substrate 100 inevitably includes the two-layer transparent conductive films (the pixel electrodes 55 and the counter electrodes 56), the wiring conversion parts 45 can be formed without increase in the number of manufacturing steps, by using the first transparent conductive films 6 being the same layer as the pixel electrodes 55 and the second transparent conductive films 7 being the same layer as the counter electrodes 56 as the two-layer transparent conductive films of the wiring conversion parts 45 (specific forming steps will be described later).

In the proximity of the corners of the first transparent conductive film 6 on the wiring conversion part 45, the first transparent conductive film 6 is formed so as not to cover the end surfaces of the semiconductor film 3, the ohmic contact film 4, and the second conductive film 5. That is, on the end of the semiconductor film 3, the ohmic contact film 4, and the second conductive film 5, the end of the first transparent conductive film 6 are formed without making contact with the first insulating film 8. Generally, film floating of an insulating film on a transparent conductive film tends to occur in the proximity of corners of the transparent conductive film, However, by employing this configuration, it is possible to avoid concentration of stress on the ends in the proximity of the corners of the first transparent conductive film 6 after forming the second insulating film 9. Accordingly, peeling of the second insulating film 9 can be suppressed, and improvement of a yield can be attained.

Furthermore, on the portions other than the proximity of the corners of the first transparent conductive film 6 on the wiring conversion part 45, the first transparent conductive film 6 is in contact with the respective end surfaces of the semiconductor film 3, the ohmic contact film 4, and the second conductive film 5. Therefore, in the case where the second conductive film 5 is a laminated film, the first transparent conductive film 6 can be connected not only to an uppermost layer but also to a lower layer.

Accordingly, even if the electrical connection between the uppermost layer of the second conductive film 5 as the laminated film and the first transparent conductive film 6 is poor, excellent electrical connection between the second conductive film 5 and the first transparent conductive film 6 can be obtained when a material attaining the excellent electrical connection with the first transparent conductive film 6 is used for at least a metal film as the lower layer of the second conductive film 5. For example, even if the upper layer of the second conductive film 5 having a two-layer structure is an Al-based metal film, and the first transparent conductive film 6 is made of ITO, excellent electrical connection between the second conductive film 5 and the first transparent conductive film 6 can be obtained by using a material attaining the excellent electrical connection with ITO for the lower layer of the second conductive film 5. Therefore, choices of wiring materials can be increased.

Next, a method of manufacturing the liquid crystal display device according to the first preferred embodiment will be described with reference to FIG. 9 to FIG. 14. FIG. 9 to FIG. 14 are sectional views showing a manufacturing step of the TFT array substrate 100 according to the first preferred embodiment. In each of these figures, the display region 41 where the TFT 51 is formed is shown in a left side, while the frame region 42 where the wiring conversion part 45 is formed is shown in a right side.

First, the first conductive film 2 is formed on an entire surface of the substrate 1 made of a transparent insulating material such as glass, for example, by a sputtering method, an evaporation method, or the like. Cr, Al, Ta, Ti, Mo, W, Ni, Cu, Au, Ag, or an alloy film mainly composed of these elements, or a laminated film made of at least two of these elements may be employed as a material of the first conductive film 2.

Secondly, a resist is coated, exposed from above a photomask, and exposed to light. The exposed resist is developed and patterned, so that a resist pattern is formed. Hereinafter, a series of steps for forming the resist pattern is called a "photolithography step".

Then, the first conductive film 2 is patterned by etching employing this resist pattern as a mask, and the resist pattern is removed. Hereinafter, the step for patterning using the resist pattern is called a "microfabrication step".

Figure 9:
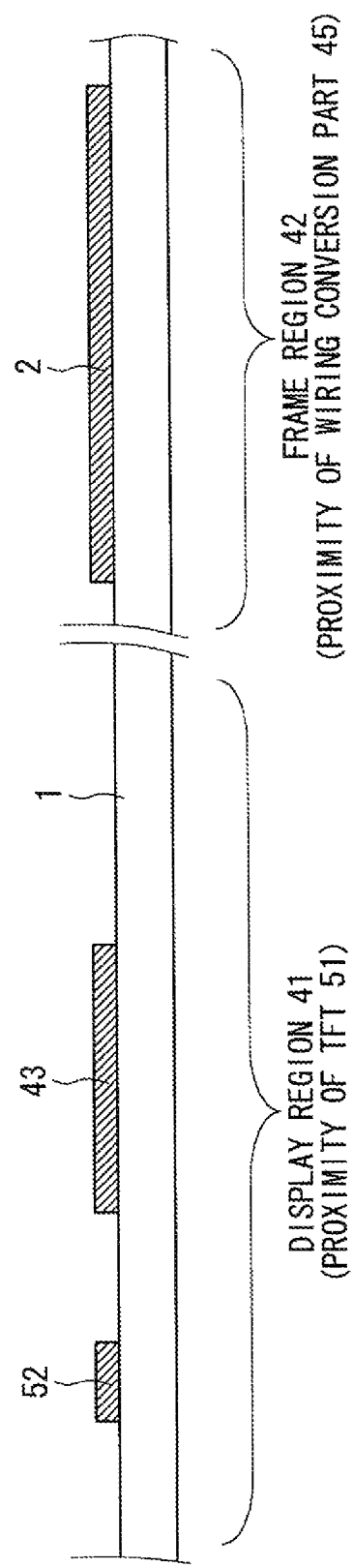
FIG. 9 to FIG. 14 are process diagrams for illustrating a method of manufacturing the TFT array substrate according to the first preferred embodiment.

As a result, as shown in FIG. 9, a pattern of the first conductive film 2 including the gate wiring 43 (gate electrode) and the common wiring 52 is formed in the display region 41. Specifically, the gate wiring 43 and the common wiring 52 are formed in the display region 41, while the lead-out wiring 47b1 drawn into the wiring conversion part 45 is formed in the frame region 42.

Thereafter, the first insulating film 8, the semiconductor film 3, and the ohmic contact film 4 are formed in this order on the entire surface of the substrate 1, for example, by using plasma CVD, atmospheric pressure CVD, low pressure CVD, or the like so as to cover the pattern of the first conductive film 2.

Silicon nitride, silicon oxide, or the like may be employed as the first insulating film 8. Since the first insulating film 8 also functions as a gate electrode, film formation is preferably performed for a plurality of times, for the purpose of preventing short circuit due to a film defect such as a pinhole. Amorphous silicon, polycrystal polysilicon, or the like may be employed as the semiconductor film 3. Further, n-type amorphous silicon or n-type polycrystalline silicon added with an impurity such as phosphorus (P) at high concentration, or the like may be employed as the ohmic contact film 4.

Furthermore, the second conductive film 5 is formed on the formed ohmic contact film 4, for example, by the sputtering method, the evaporation method, or the like. A laminated film formed by using Cr, Al, Ta, Ti, Mo, W, Ni, Cu, Au, Ag, or an alloy film mainly composed of these elements may be employed as the second conductive film 5.

Thereafter, the second conductive film 5 is patterned through a photolithography step and a microfabrication step. Thus, a pattern of the source wiring 44, the source electrode 53, and the drain electrode 54 is formed in the display region 41. However, the source electrode 53 and the drain electrode 54 are not separated at this stage (that is, the second conductive film 5 remains on the channel region of the semiconductor film 3).

Figure 10:
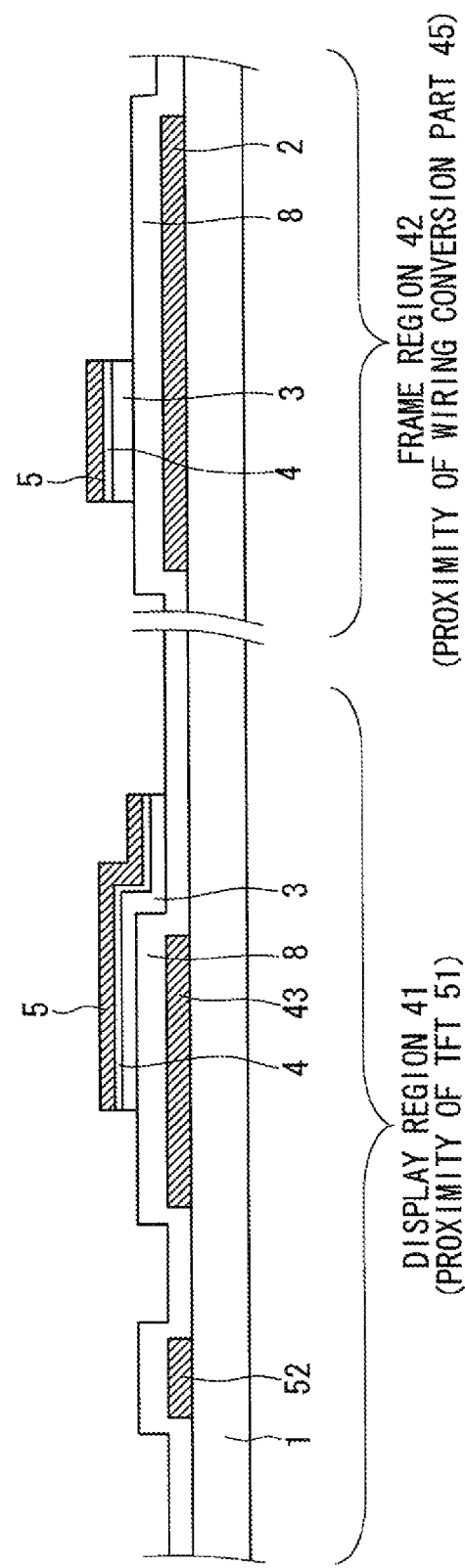

Next, by employing the patterned second conductive film 5 as a mask, or employing the resist pattern used in the patterning of the second conductive film 5 as the mask, (that is, in a state where the resist pattern used in the patterning of the second conductive film 5 remains), the ohmic contact film 4 and the semiconductor film 3 are etched. Thus, as shown in FIG. 10, portions, not covered with the second conductive film 5, of the ohmic contact film 4 and the semiconductor film 3 are removed. As a result, in the display region 41, the semiconductor film 3 and the ohmic contact film 4 are patterned so as to have the same shapes as the source wiring 44.

Thus, the patterning of the second conductive film 5, the ohmic contact film 4, and the semiconductor film 3 is continuously performed in a single photolithography step.

Figure 11:
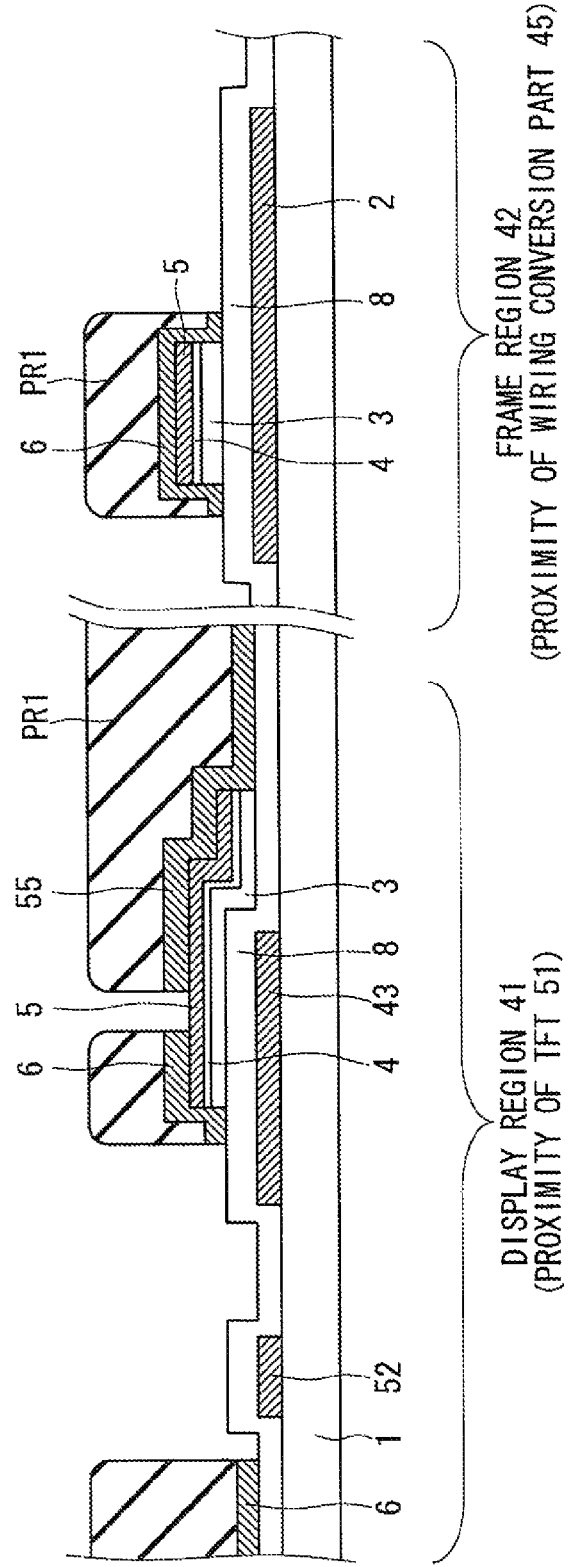

Next, the transparent conductive film such as ITO is formed on the entire surface of the substrate 1 by the sputtering method or the like. In the present preferred embodiment, general ITO is formed in a non-crystalline state. Then, a resist pattern PR1 is formed by a photolithography step, and the transparent conductive film is patterned by a microfabrication step using the resist pattern PR1. Consequently, the first transparent conductive film 6 is formed as shown in FIG. 11. For this patterning, wet etching with weakly acidic etchant such as oxalic acid series suitable for etching of non-crystalline ITO may be employed.

In the display region 41, the first transparent conductive film 6 and the pixel electrode 55 covering the second conductive film 5 are formed through this step. As shown in FIG. 11, the transparent conductive film on the channel region of the semiconductor film 3 is removed at this time (that is, the first transparent conductive film 6 is separated into the source region side and the drain region side). The arrangement and the shape of the first transparent conductive film 6 including the pixel electrode 55 are established through this step.

Also in the frame region 42, the first transparent conductive film 6 is formed on the second conductive film 5. However, in the proximity of the corner of the first transparent conductive film 6 (not shown in FIG. 11), the end of the first transparent conductive film 6 is arranged so as to be located further inside the ends of the semiconductor film 3, the ohmic contact film 4, and the second conductive film 5, while as shown in FIG. 11, on the portion other than the proximity of the corner of the first transparent conductive film 6, the end of the first transparent conductive film 6 is arranged so as to be located further outside the width of the semiconductor film 3, the ohmic contact film 4, and the second conductive film 5.

Figure 12:
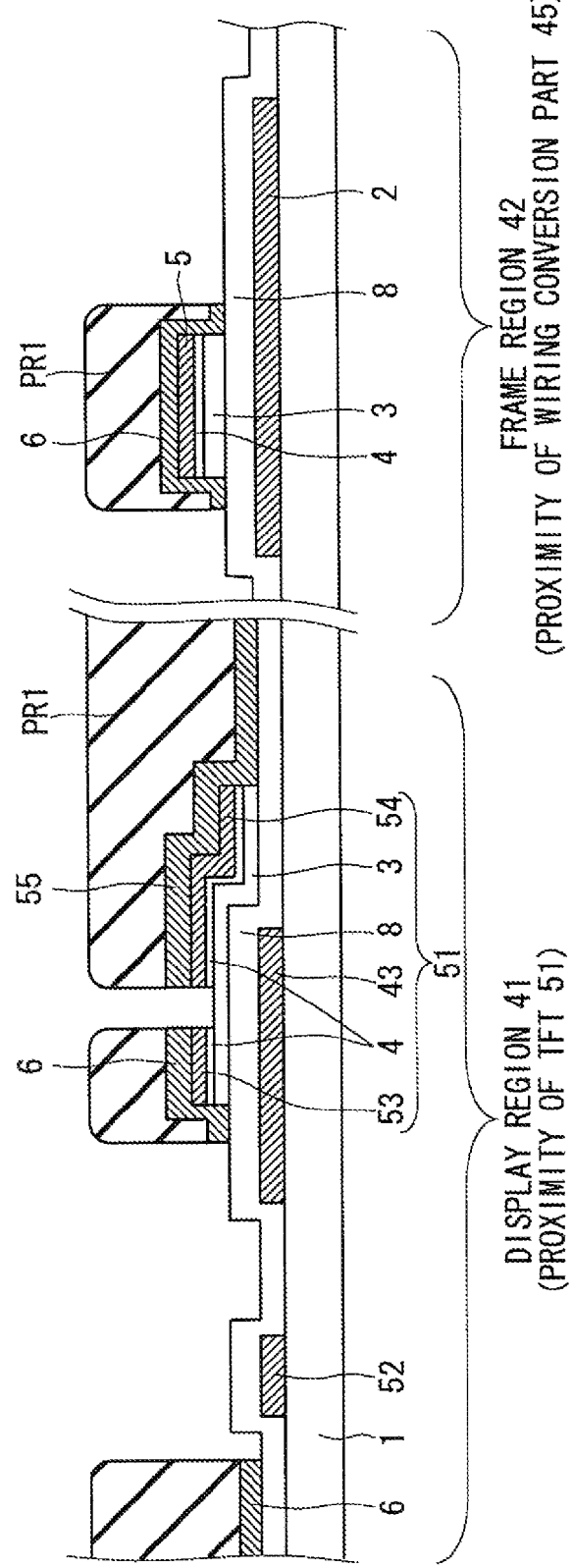

The second conductive film 5 and the ohmic contact film 4 on the channel region are sequentially removed by etching employing the resist pattern PR1 as a mask. The second conductive film 5 on the channel region is removed by etching, so that the second conductive film 5 is separated into the source electrode 53 and the drain electrode 54. Thus, as shown in FIG. 12, the semiconductor film 3 serving as the channel region of the TFT 51 is exposed between the source electrode 53 and the drain electrode 54, and the configuration of the ITT 51 is completed.

At this time since portions, protruding from the first transparent conductive film 6, of the ohmic contact film 4, and the second conductive film 5 are removed in the proximity of the corners of the first transparent conductive film 6 in the frame region 42, the ends of the ohmic contact film 4, the second conductive film 5, and the first transparent conductive film 6 are located substantially on the same position, and located at a receded position from the semiconductor film 3.

Figure 13:
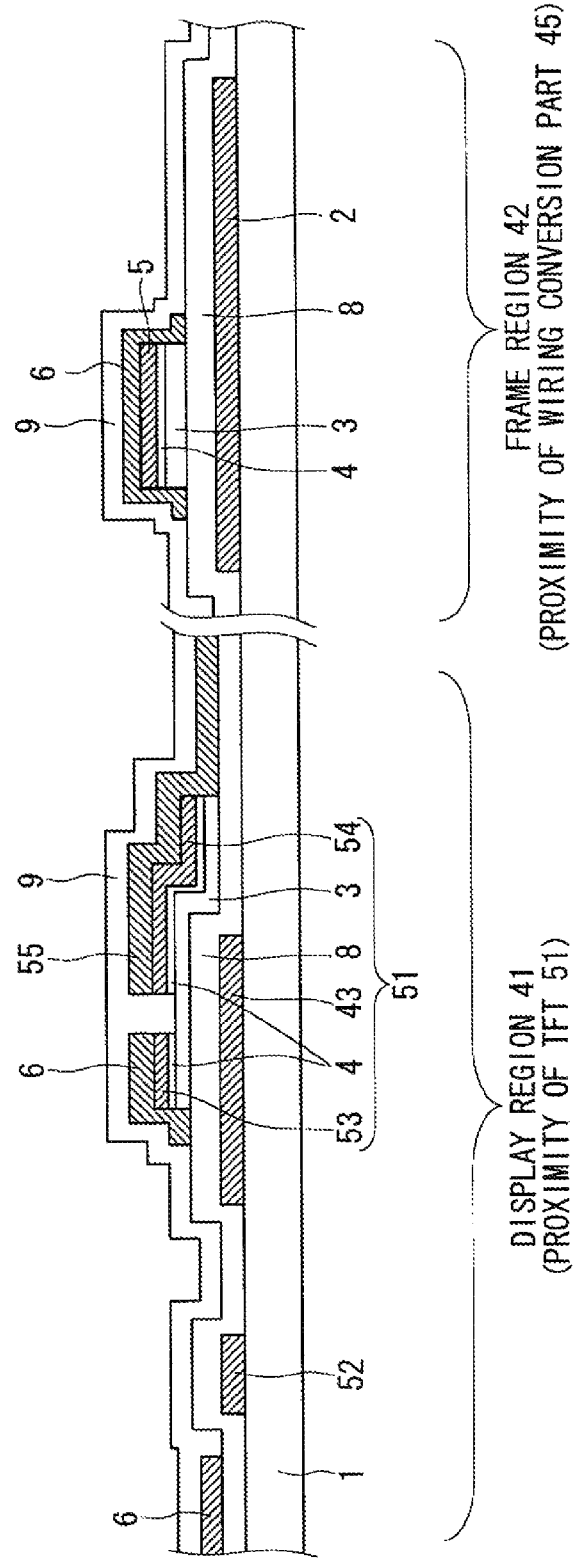

After removing the resist pattern PR1, as shown in FIG. 13, the second insulating film 9 is formed on the entire surface of the substrate 1. Thus, the first transparent conductive film 6 including the pixel electrode 55 and the channel region of the semiconductor film 3 are covered by the second insulating film 9. An inorganic insulating film, for example, such as silicon nitride or silicon oxide may be employed as the second insulating film 9, and CVD or the like may be employed as a film forming method. The second insulating film 9 may be a laminated film in which a coating type insulating film (formed by coating) or the like is further formed on the inorganic insulating film such as silicon nitride or silicon oxide.

As described above, in the present preferred embodiment, in the proximity of the corners of the first transparent conductive film 6 in the frame region 42 (wiring conversion part 45), the first transparent conductive film 6 is configured so as not to cover the outer peripheral ends of the semiconductor film 3, the ohmic contact film 4, and the second conductive film 5. Consequently, concentration of stress on the ends in the proximity of the corners of the first transparent conductive film 6 after forming the second insulating film 9 is suppressed. Thus, the film floating of the second insulating film 9 is prevented.

Accordingly, as to a film forming condition of the second insulating film 9, the frequency of occurrence of the film floating can be reduced even if a condition not specialized in prevention of film floating, for example, such as a film forming condition for improving the transmittance of the first transparent conductive film 6, or a film forming condition for enabling an excellent contact end surface shape to be formed on the first transparent conductive film 6 when forming the contact hole CH2 in the second insulating film 9 is employed. When a film forming condition for improving the transmittance is employed also for a forming condition of the first transparent conductive films 6, occurrence of the film floating of the second insulating film 9 may be facilitated. However, with the above configuration, the frequency of occurrence of the film floating can be reduced.

Examples of the film foil/ling conditions of the second insulating film 9 for improving the transmittance of the first transparent conductive film 6 include a film forming condition for having the high oxygen content in material gas at the time of film formation, more specifically, a film forming condition for forming a silicon oxide film, a film forming condition for forming a silicon nitride film containing oxygen, and the like. On the other hand, an example of the film forming condition of the second insulating film 9 for enabling the excellent contact end surface shape to be foliated on the first transparent conductive film 6 when forming the contact hole CH2 in the second insulating film 9, includes a film forming condition for having the high nitrogen content in the material gas at the time of film formation of silicon nitride, more specifically, a film forming condition in which the division ratio of nitrogen gas or ammonia gas in the material gas at the time of film formation is 2 or more with respect to gas containing silicon (silane gas, disilane gas, TEOS gas, or the like).

Furthermore, an example of the film forming condition for improving the transmittance of the first transparent conductive film 6 such as ITO includes selection of a condition for having the high oxygen concentration at the time of film formation by a sputtering method or the like. The film forming conditions of the second insulating film 9 and the first transparent conductive film 6 are used according to the application of the TFT array substrate 100.

The contact holes CH1 to CH3 are formed in the second insulating film 9 and first insulating film 8 through a photolithography step and a microfabrication step. Thus, the contact hole CH1 reaching the common wiring 52 is formed in the display region 41. The contact hole CH2 reaching the first transparent conductive film 6, and the contact hole CH3 reaching the first conductive film 2 are formed in the frame region 42.

Figure 14:
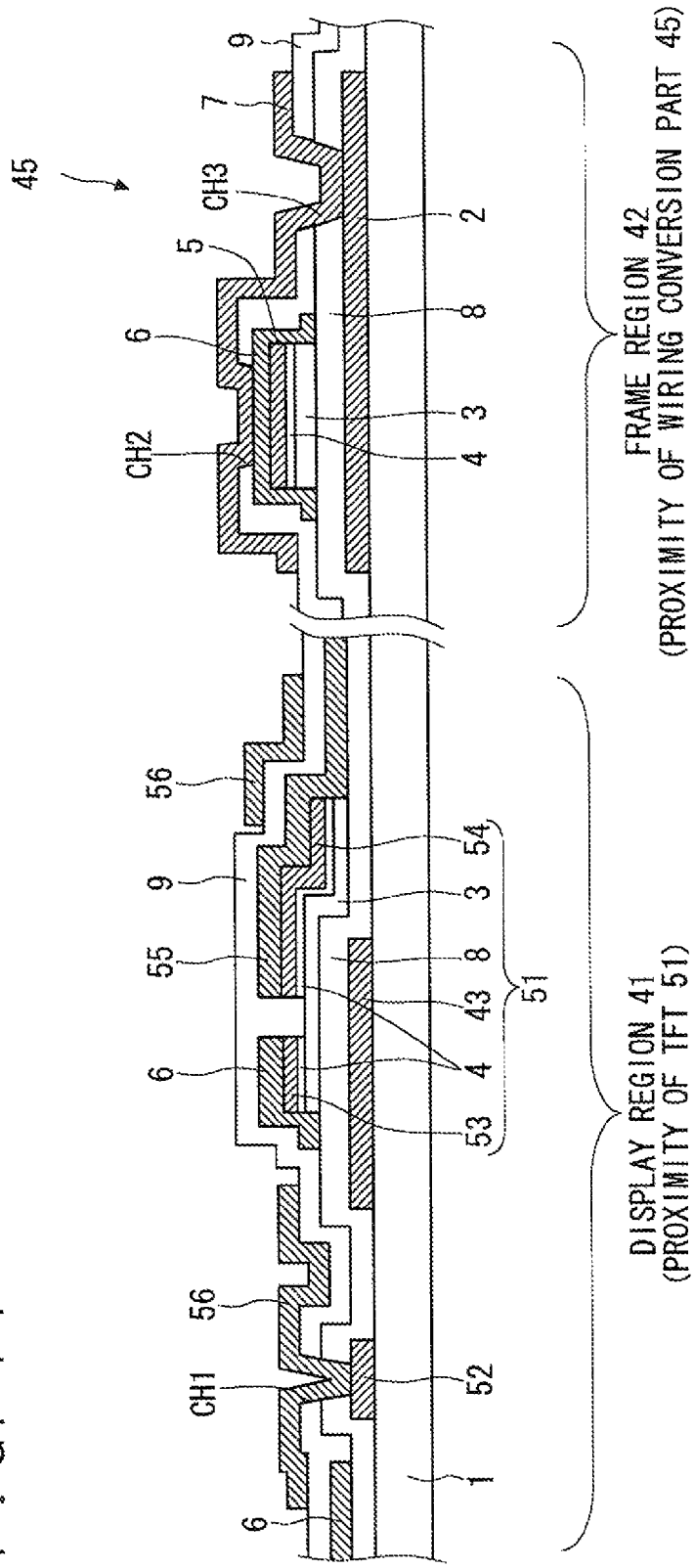

A transparent conductive film such as ITO is formed on the second insulating film 9 on the entire surface of the substrate 1 by a sputtering method or the like. Then, this transparent conductive film is patterned through a photolithography step and a microfabrication step to form the second transparent conductive film 7. Thus, as shown in FIG. 14, the counter electrode 56 is formed on a position opposed to the pixel electrode 55 in the display region 41. The counter electrode 56 is formed so as to be connected to the common wiring 52 through the contact hole CH1. In the frame region 42, the second transparent conductive film 7 is electrically connected to the first conductive film 2 and the first transparent conductive film 6 through the contact hole CH2 and the contact hole CH3.

The external connection terminal 48$b$1 disposed in the frame region 42 is configured by the second transparent conductive film 7 connected to the lead-out wiring 47$b$1 as the first conductive film 2 through the contact holes. This external connection terminal 48$b$1 is formed at the same time when the wiring conversion part 45 are formed.

The TFT array substrate 100 of the first preferred embodiment is completed through the steps described above.

The oriented films 61 are respectively formed on the completed TFT array substrate 100, and on the separately prepared counter substrate 60, and are subject to orientation treatment for unidirectionally putting minute scratches on contact surfaces in contact with the liquid crystal, with a method such as rubbing. Then, a seal material is coated on a peripheral edge of the TFT array substrate 100 or the counter substrate 60, and the TFT array substrate 100 and the counter substrate 60 are bonded together with a predetermined interval such that the respective oriented films 61 face each other. Thereafter, liquid crystal is injected between the TFT array substrate 100 and the counter substrate 60 by a vacuum injection method or the like to be sealed. Then, the TFT array substrate 100 and the counter substrate 60 are respectively bonded with the polarizing plates 65, and connected to a drive circuit to form the liquid crystal display panel.

Thereafter, the backlight unit 67 is disposed on a rear surface side of the TFT array substrate 100, which is the back surface side of the liquid crystal display panel, with the optical films 66 such as retardation films interposed therebetween. These components are housed in the frame made of resin, metal, or the like, so that the liquid crystal display device is completed.

In the liquid crystal display device of the first preferred embodiment, on the wiring conversion part 45 disposed in the frame region 42, in which a pattern density of the transparent conductive film is relatively sparse, the first transparent conductive film 6 is formed so as not to cover the end surface of the second conductive film 5 in the proximity of the corner thereof. Consequently, occurrence of the film floating of the second insulating film 9 covering the first transparent conductive film 6 is suppressed.

Furthermore, on the wiring conversion part 45, the first transparent conductive film 6 is connected to the metal film as the lower layer of the second conductive film 5 in the proximity of the portion other than the corner of the first transparent conductive film 6. Therefore, even if the electrical connection between the uppermost layer of the second conductive film 5 and the first transparent conductive film 6 is poor, excellent electrical connection between the second conductive film 5 and the first transparent conductive film 6 can be obtained when the electrical connection between the lower layer of the second conductive film 5 and the first transparent conductive film 6 is good.

In the above description, the wiring structure according to the present invention is applied to the wiring conversion part 45 arranged in the frame region 42 of the TFT array substrate 100, however, the wiring structure may be applied to the wiring in the frame region 42 (e.g., extending portion of the source wiring 44). Since portions around the wiring in the frame region 42 are also regions where the pattern density of the transparent conductive film is sparse as compared to the display region 41, the film floating of the second insulating film 9 tends to occur. However, the occurrence of the film floating of the second insulating film 9 can be suppressed by applying the wiring structure of the present invention to the aforementioned wiring.

For example, in the case where this wiring structure is applied to the source wiring 44 (extending portion of the source wiring 44) extending in the frame region 42, the end of the first transparent conductive film 6 is arranged further inside the second conductive film 5 in the proximity of the corner of the first transparent conductive film 6 on the source wiring 44 such that the end surface of the second conductive film 5 is not covered with the first transparent conductive film 6, whereas the end of the first transparent conductive film 6 is arranged further outside the second conductive film 5 on the portion other than the above such that the end surface of the second conductive film 5 is covered with the first transparent conductive film 6.

With this configuration, effects similar to the effects obtained on the wiring conversion part 45 can be obtained also on the source wiring 44. That is the film floating of the second insulating film 9 on the source wiring 44 can be prevented. Furthermore, even in the case where a material having a property of poor electrical connection with the first transparent conductive film 6 is employed to the uppermost layer of the second conductive film, the excellent, electrical connection between the second conductive film 5 and the first transparent conductive film 6 can be obtained.

In the TFT array substrate 100 of the present preferred embodiment, the interdigital counter electrode 56 formed by the second transparent conductive film 7 is configured so as to be located above the plate-like pixel electrode 55 formed by the first transparent conductive film 6. However, on the FFS mode liquid crystal display device, the respective shapes of the pixel electrode 55 and the counter electrode 56 may be opposite to the aforementioned shapes. That is, the interdigital pixel electrode 55 may be formed by the first transparent conductive film 6. However, in this case, since the plate-like counter electrode 56 is required to be arranged on the lower layer than the interdigital pixel electrode 55, the transparent conductive film configuring the plate-like counter electrode 56 is required to be formed separately from the second transparent conductive film 7.

Second Preferred Embodiment

Figure 15:
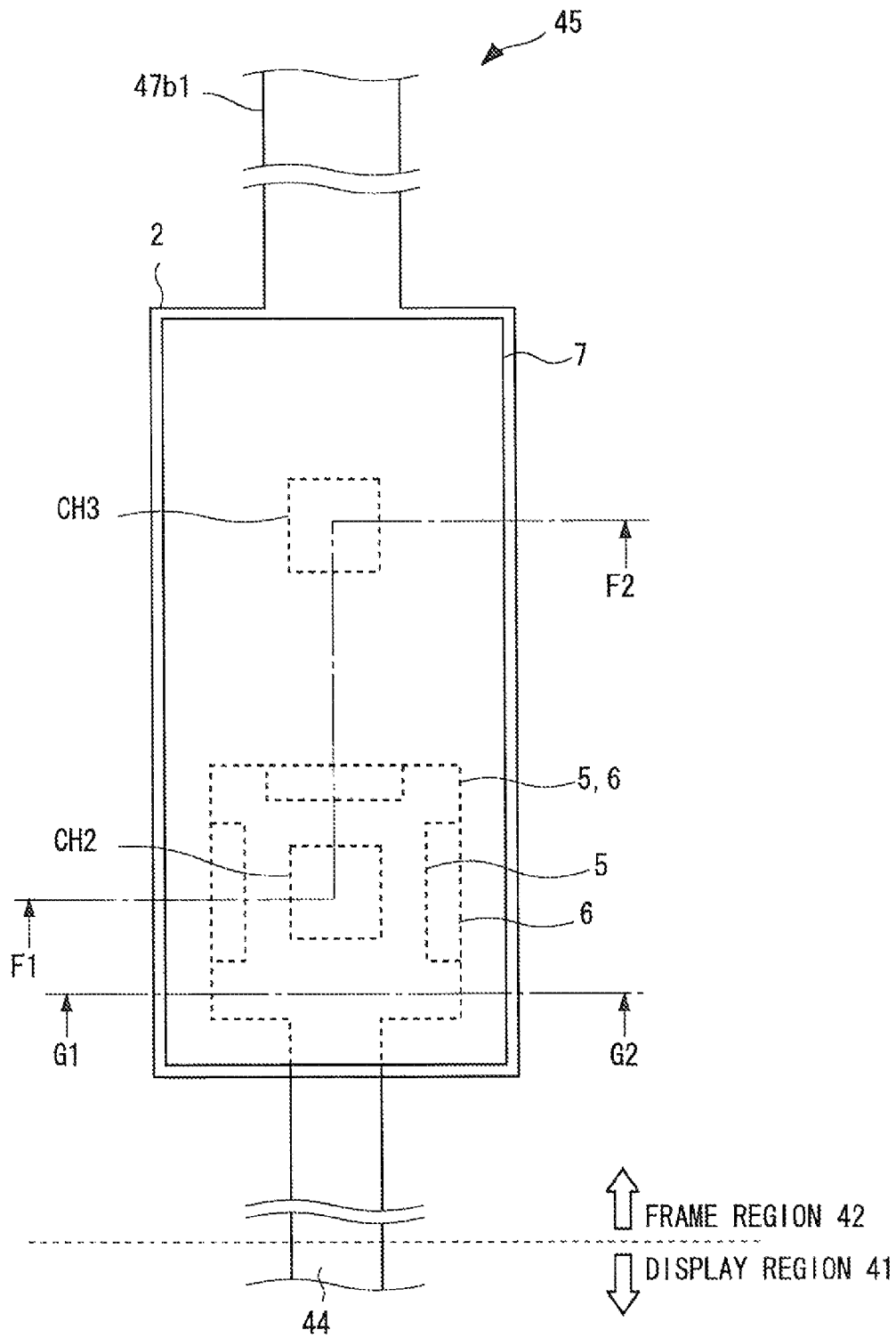
FIG. 15 is a plan view of a wiring conversion part of a TFT array substrate according to a second preferred embodiment.
Figure 16:
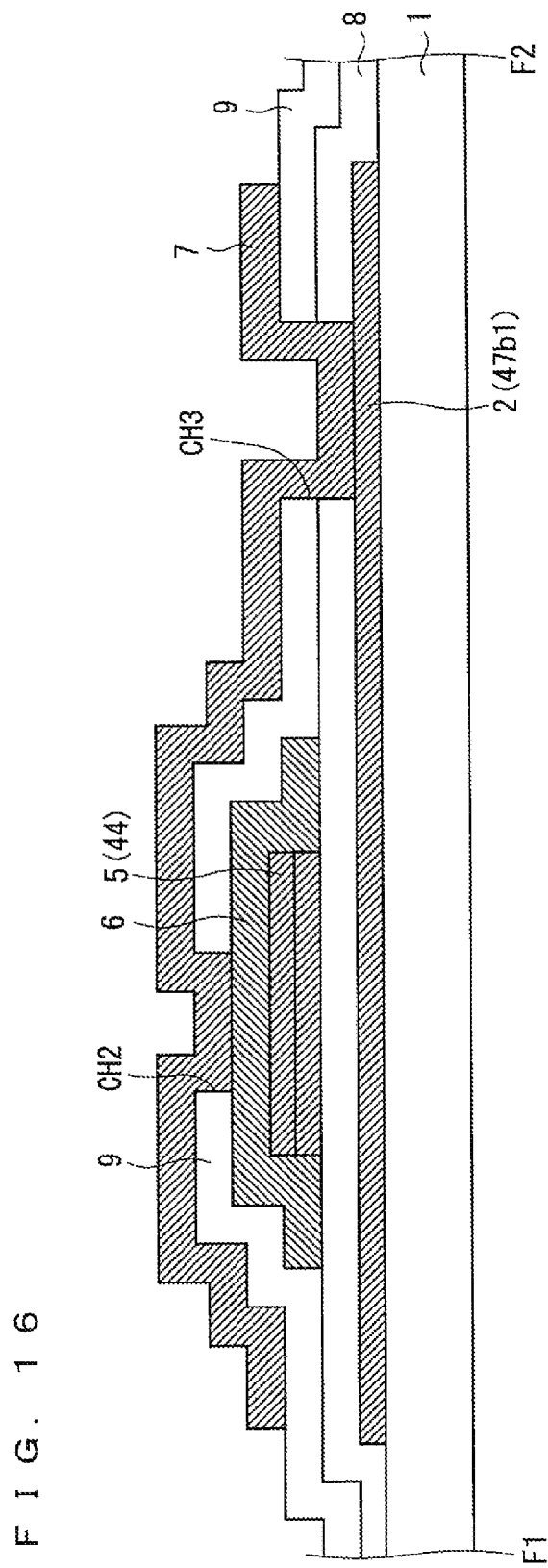
FIG. 16 and FIG. 17 are sectional views of a wiring conversion part of the TFT array substrate according to the second preferred embodiment.
Figure 17:
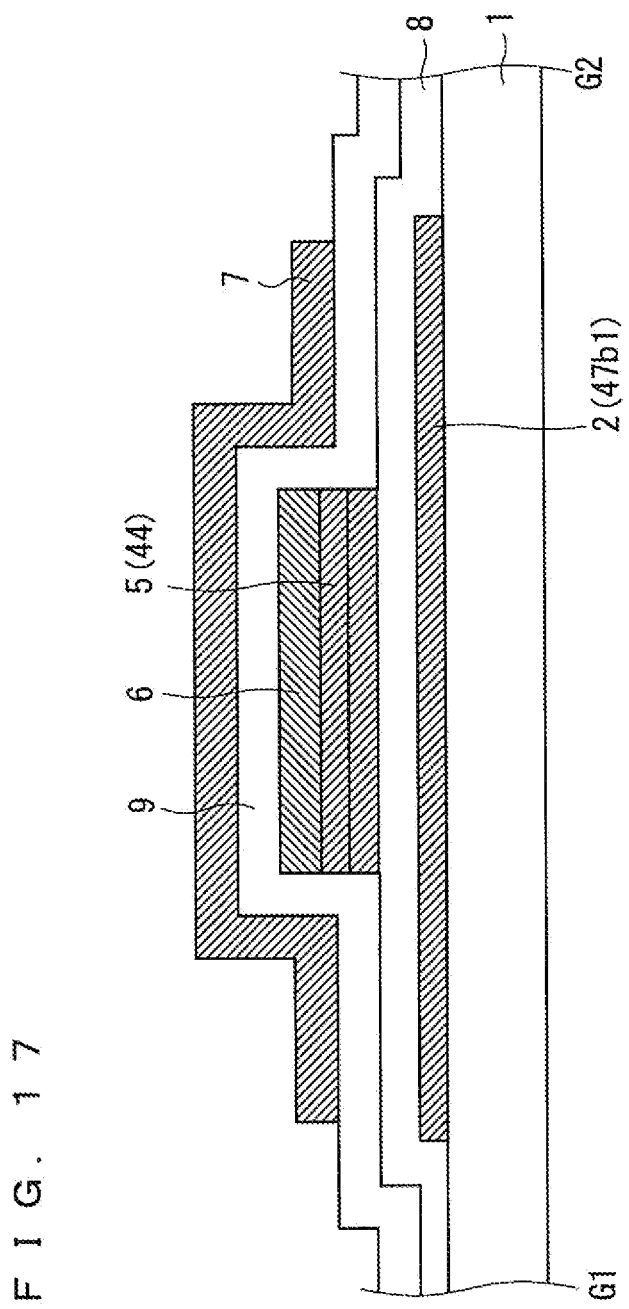
Figure 18:
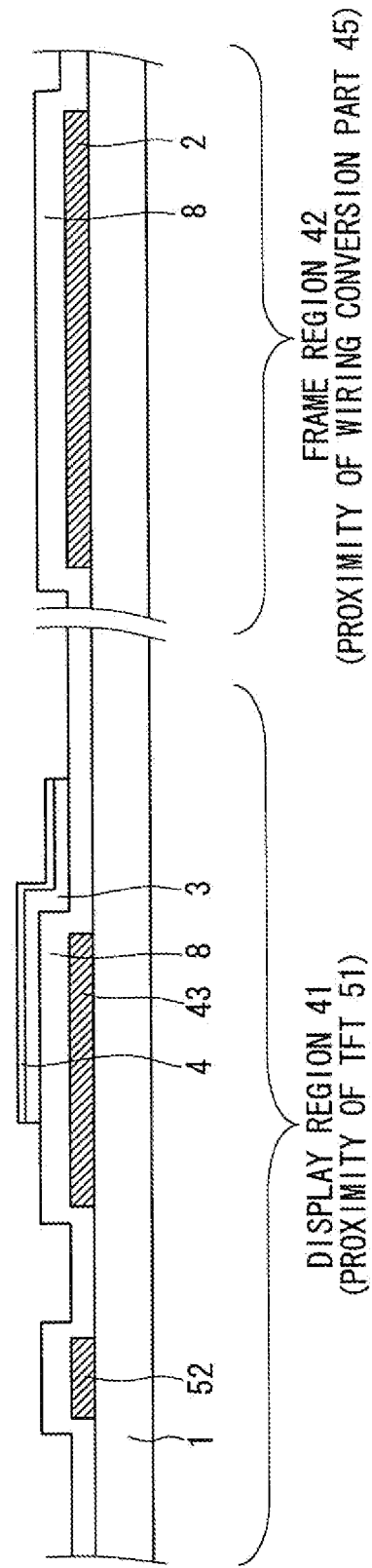

FIG. 15 to FIG. 17 are views showing a configuration of a wiring conversion part 45 of a TFT array substrate 100 according to a second preferred embodiment. FIG. 15 is a plan view of the wiring conversion part 45, FIG. 16 is a sectional view taken along line F1-F2 in FIG. 15, and FIG. 17 is a sectional view taken along line G1-G2 in FIG. 15.

The wiring conversion part 45 of the second preferred embodiment is configured such that an ohmic contact film 4 and a semiconductor film 3 are not disposed below a second conductive film 5, as compared to the configuration of the first preferred embodiment (FIG. 5, FIG. 7).

With this configuration, a step that a second transparent conductive film 7 climbs over on a second insulating film 9 is smaller than that of the first preferred embodiment. Therefore, a probability of disconnection of a first transparent conductive film and the second transparent conductive film 7 on a step part is further reduced, and a wiring conversion part with higher reliability can be obtained. Additionally, similarly to the first preferred embodiment, an effect of suppression of occurrence of film floating, and an effect of obtaining excellent electrical connection between the first transparent conductive film 6 and the second conductive film 5 can be also obtained.

Although a method of manufacturing the TFT array substrate 100 including the wiring conversion part 45 according to the second preferred embodiment is substantially the same as that of the first preferred embodiment, patterning of the ohmic contact film 4 and the semiconductor film 3, and patterning of the second conductive film 5 are required to be individually performed by using a resist pattern.

Hereinafter, the method of manufacturing the TFT array substrate 100 according to the second preferred embodiment will be described with reference to FIG. 18 to FIG. 23.

First, a gate wiring 43, a common wiring 52, and a first conductive film 2 including a lead-out wiring 47b1 are formed on a substrate 1 in manner similar to the first preferred embodiment (FIG. 9).

Thereafter, the semiconductor film 3, the ohmic contact film 4, and the second conductive film 5 are patterned, so that a source wiring 44, a source electrode 53, a drain electrode 54, and the like are formed. At this time, the semiconductor film 3, the ohmic contact film 4, and the second conductive film 5 are patterned through a single photolithography step in the first preferred embodiment, however, the patterning of the semiconductor film 3 and the ohmic contact film 4, and the patterning of the second conductive film 5 are performed separately in the second preferred embodiment.

Figure 19:
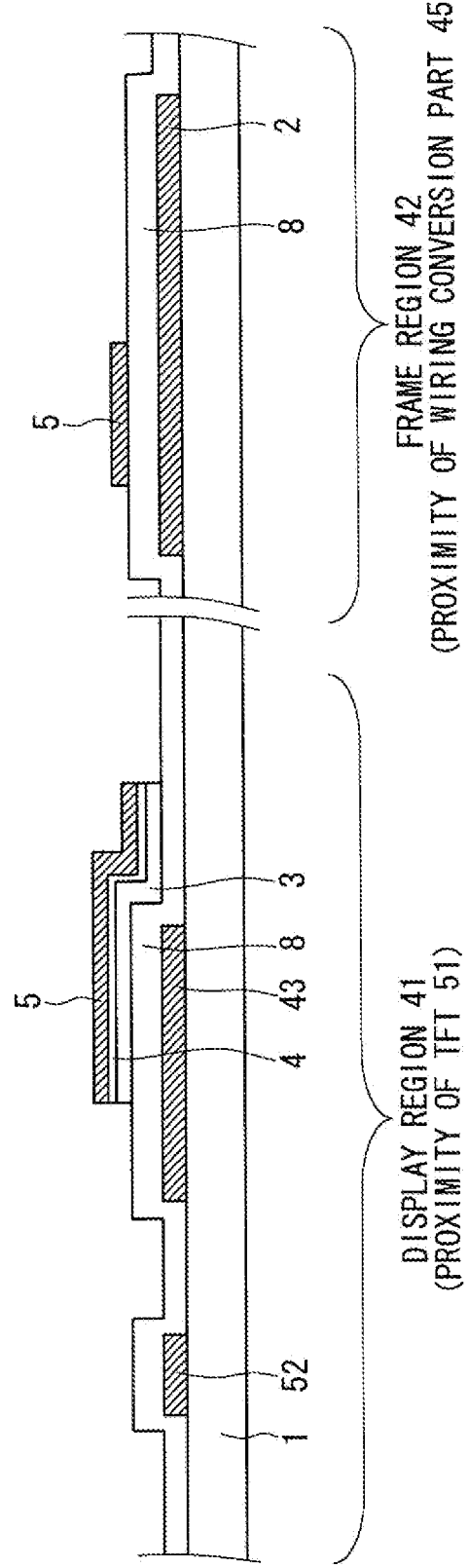
Figure 20:
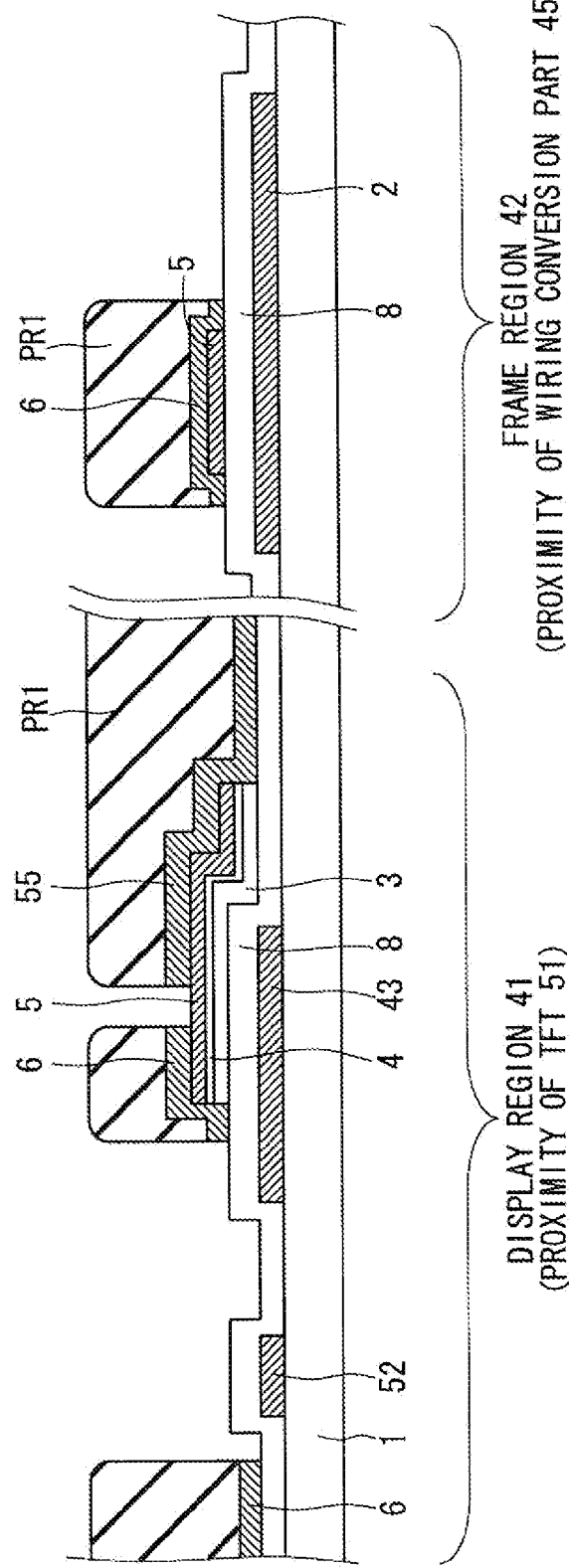

That is, the semiconductor film 3 and the ohmic contact film 4 are first formed to perform first patterning (FIG. 18), and thereafter, the second conductive film 5 is formed to perform second patterning (FIG. 19). At the time of the first patterning, the semiconductor film 3 and the ohmic contact film 4 on a formation region of the wiring conversion part 45 are removed as in FIG. 18. Consequently, as in FIG. 19, a pattern of the second conductive film 5 without the semiconductor film 3 and the ohmic contact film 4 below the second conductive film 5 can be formed on the formation region of the wiring conversion part 45 by the second patterning.

Thereafter, with procedures similar to those described with reference to FIG. 11 to FIG. 14 in the first preferred embodiment, formation of the first transparent conductive film 6 including a pixel electrode 55 (FIG. 20), removal of the second conductive film 5 and the ohmic contact film 4 on the channel region of the TFT 51 (FIG. 21), film formation of the second insulating film 9 (FIG. 22), formation of contact holes CH1 to CH3, and formation of the second transparent conductive film 7 including the counter electrode 56 (FIG. 23) are sequentially performed. Thus, the TFT array substrate 100 having the wiring conversion part 45 with the structure shown in FIG. 15 to FIG. 17 is formed.

In each of the above preferred embodiments, the present invention is applied to the FFS mode TFT array substrate. This is because the FFS mode TFT array substrate includes two-layer transparent conductive films, and the present invention is applicable while suppressing increase in the number of the manufacturing steps. The present invention is widely applicable to thin film electronic devices using transparent conductive films as wirings or electrodes. Examples of the thin film electronic devices other than the liquid crystal display device including the TFT array substrate include, for example, a flat display device (flat panel display) such as an organic EL display device, and a photoelectric conversion device such as an image sensor. Also on the wiring or the wiring conversion part provided in the TFT array substrate of these thin film electronic devices, the present invention is applicable to the structure in which the transparent conductive film pattern is provided on the metal pattern, and the insulating film is further provided on the transparent conductive film.

The preferred embodiments of the present invention can be freely combined with each other, or the preferred embodiments of the present invention can be appropriately modified or omitted, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A wiring structure comprising:
an upper layer conductive film; and
a first transparent conductive film formed on said upper layer conductive film to be in contact with said upper layer conductive film, wherein
said first transparent conductive film does not cover an end surface of said upper layer conductive film in proximity to a corner of the first transparent conductive film, and has a portion that covers the end surface of said upper layer conductive film to contact the end surface of said upper layer conductive film on a portion other than said proximity of the corner.

2. The wiring structure according to claim 1, wherein said upper layer conductive film is a laminated film formed by stacking different types of conductive films.

3. The wiring structure according to claim 1, further comprising: a semiconductor film electrically connected to the upper layer conductive below said upper layer conductive film.

4. The wiring structure according to claim 1, wherein no semiconductor film is formed below said upper layer conductive film.

5. The wiring structure according to claim 1, further comprising:
an insulating film formed on said first transparent conductive film;
a lower layer conductive film as a layer different from said upper layer conductive film, formed below said insulating film;
a first contact hole formed in said insulating film, and reaching said first transparent conductive film;
a second contact hole formed in said insulating film, and reaching said lower layer conductive film; and
a second transparent conductive film formed on said insulating film, connected to said first transparent conductive film through said first contact hole, and connected to said lower layer conductive film through said second contact hole.

6. A thin film transistor array substrate comprising:
the wiring structure according to claim 1.

7. A display device comprising:
a display panel formed by using the thin film transistor array substrate according to claim 6.

* * * * *